(12) United States Patent
Xie

(10) Patent No.: US 9,831,833 B1
(45) Date of Patent: Nov. 28, 2017

(54) POWER AMPLIFIER

(71) Applicant: Rockwell Collins, Inc., Cedar Rapids, IA (US)

(72) Inventor: Chenggang Xie, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 15/009,378

(22) Filed: Jan. 28, 2016

(51) Int. Cl.
| | |
|---|---|
| *H04B 1/04* | (2006.01) |
| *H03F 3/68* | (2006.01) |
| *H03F 1/02* | (2006.01) |
| *H03F 1/32* | (2006.01) |
| *H03F 3/193* | (2006.01) |
| *H03F 3/21* | (2006.01) |
| *H04B 1/10* | (2006.01) |
| *H04B 1/40* | (2015.01) |

(52) U.S. Cl.
CPC ......... *H03F 1/0205* (2013.01); *H03F 1/3205* (2013.01); *H03F 3/193* (2013.01); *H03F 3/211* (2013.01); *H04B 1/10* (2013.01); *H04B 1/40* (2013.01); *H03F 2200/294* (2013.01); *H03F 2200/451* (2013.01); *H03F 2203/21142* (2013.01)

(58) Field of Classification Search
CPC .......... H04B 1/04; H04B 1/0458; H04B 1/40; H04B 5/0037; H04B 2001/0408; H03F 3/24; H03F 2200/18; H03F 2200/222; H03F 2200/318; H03F 2200/378; H03F 2200/555; H03G 3/20; H03G 3/3036
USPC ..... 455/114.2, 114.3, 127.2, 127.3; 375/296, 375/297; 330/278, 295, 296
See application file for complete search history.

(56) References Cited

U.S. PATENT DOCUMENTS

| | | | |
|---|---|---|---|
| 2,813,247 A | 11/1957 | Decker | |
| 4,236,119 A | 11/1980 | Battjes | |
| 4,437,070 A | 3/1984 | Horl | |
| 5,321,746 A | 6/1994 | Bader | |
| 5,399,988 A | 3/1995 | Knierim | |
| 5,712,592 A | 1/1998 | Stimson et al. | |
| 5,796,307 A | 8/1998 | Kumagai et al. | |
| 5,828,763 A | 10/1998 | Koyano et al. | |
| 5,915,213 A * | 6/1999 | Iwatsuki ............... | H03F 1/3247 375/297 |
| 5,973,557 A * | 10/1999 | Miyaji ................. | H03F 1/0277 330/124 R |
| 6,049,704 A * | 4/2000 | Peckham ............. | H03G 3/3036 330/279 |
| 6,377,118 B1 * | 4/2002 | Shigaki ................. | H03F 1/3276 330/149 |
| 6,400,222 B1 * | 6/2002 | Takahashi ............. | H03F 1/3276 330/145 |
| 6,614,308 B2 * | 9/2003 | Moller .................... | H01L 23/48 257/E23.01 |
| 6,684,065 B2 | 1/2004 | Bult et al. | |

(Continued)

*Primary Examiner* — Quochien B Vuong
(74) *Attorney, Agent, or Firm* — Angel N. Gerdzhikov; Donna P. Suchy; Daniel M. Barbieri

(57) ABSTRACT

A power amplifier including a power amplifier stage. The power amplifier stage may be configured to receive a signal, amplify the signal at saturation with substantially zero amplitude-phase (AM-PM) distortion, and output the amplified signal as an output signal. The power amplifier may be a single stage power amplifier or a multi-stage power amplifier.

16 Claims, 16 Drawing Sheets

(56) References Cited

U.S. PATENT DOCUMENTS

| | | | |
|---|---|---|---|
| 6,977,546 B2 * | 12/2005 | Stapleton | H03F 3/2171 |
| | | | 330/10 |
| 6,998,918 B2 | 2/2006 | Doherty et al. | |
| 7,076,226 B2 | 7/2006 | Bult et al. | |
| 7,196,578 B2 | 3/2007 | Kermalli | |
| 7,414,577 B2 | 8/2008 | Mohamadi | |
| 7,545,322 B2 | 6/2009 | Newberg et al. | |
| 7,656,964 B1 | 2/2010 | DeCoste et al. | |
| 7,962,108 B1 * | 6/2011 | Khlat | H04B 1/0475 |
| | | | 455/114.3 |
| 8,195,188 B2 | 6/2012 | Fomukong et al. | |
| 8,269,543 B2 | 9/2012 | Teetzel | |
| 8,330,432 B2 | 12/2012 | Van Zyl et al. | |
| 8,489,052 B2 | 7/2013 | Bult et al. | |
| 8,749,306 B2 | 6/2014 | Pengelly | |
| 8,810,318 B2 * | 8/2014 | Na | H03F 1/0266 |
| | | | 330/285 |
| 8,847,351 B2 * | 9/2014 | Klemens | H01L 23/645 |
| | | | 257/499 |
| 8,903,342 B1 | 12/2014 | Wyse et al. | |
| 9,093,984 B1 | 7/2015 | Hageman et al. | |
| 2006/0139091 A1 | 6/2006 | Fratti | |
| 2006/0176217 A1 | 8/2006 | Lewis | |
| 2006/0238245 A1 | 10/2006 | Carichner et al. | |
| 2010/0148877 A1 | 6/2010 | Oakley et al. | |
| 2011/0080154 A1 | 4/2011 | Yin et al. | |
| 2012/0014278 A1 | 1/2012 | Ameti et al. | |
| 2012/0286899 A1 | 11/2012 | Lan et al. | |
| 2013/0194017 A1 | 8/2013 | Staudinger | |

* cited by examiner

POWER AMPLIFIER

CROSS-REFERENCE TO RELATED APPLICATIONS

The present application is related to U.S. patent application Ser. No. 13/714,209, filed on Dec. 13, 2012, to U.S. patent application Ser. No. 13/737,777, filed on Jan. 9, 2013, which issued as U.S. Pat. No. 8,903,342 on Dec. 2, 2014, to U.S. patent application Ser. No. 13/837,934, filed on Mar. 15, 2013, to U.S. patent application Ser. No. 14/206,632, filed on Mar. 12, 2014, to U.S. patent application Ser. No. 14/030,557, filed on Sep. 18, 2013, to U.S. patent application Ser. No. 14/136,440, filed on Dec. 20, 2013, and to U.S. patent application Ser. No. 14/607,878, filed on Jan. 28, 2015, all of which are hereby expressly incorporated herein in their entirety.

BACKGROUND

Electronically scanned arrays (ESAs; sometimes referred to as phased array radars or phased array antennas) may be active ESAs (AESAs) or passive ESAs (PESAs). ESAs often include radiofrequency (RF) power amplifiers. Such RF power amplifiers receive RF power inputs and output amplified RF signals that are provided to antenna elements of such ESAs.

Currently implemented RF power amplifiers for ESAs can operate in a linear state or in a compression state (also referred to as saturation). When a currently implemented RF power amplifier operates in a linear state (which also may be referred to as a linear region), phase of the power amplifier output remains relatively constant and the RF power amplifier's amplitude increases proportionally to an increase in RF power input. Operating in a linear state typically results in poor efficiency (e.g., power added efficiency (PAE)).

When a currently implemented RF power amplifier operates in a compression state, the efficiency and phase increase as the RF output at the RF power amplifier increases. This effect is sometimes referred to as amplitude-phase distortion ("AM-PM distortion") and may be measured in degrees per decibel (dB). AM-PM distortion is undesirable for communication systems and is especially undesirable for ESA systems.

Precise aperture phase and amplitude control are required for high performance AESAs. AM-PM distortion during compression can result in imprecise phase shift, which often results in reduced beam pointing accuracy. The amplitude and phase of transmitted power at each antenna element in an ESA is dependent on the RF input to the RF power amplifier. Any of various sources of error, such as from processes, materials, and assembly variations, can cause small disturbances in the RF input signal applied to an RF power amplifier that can result in a deviation from a desired amplitude and phase for a transmitted signal from the ESA. While operating an RF power amplifier at compression typically reduces the output amplitude's sensitivity to deviations in the RF input power and improves system efficiency, the phase is typically strongly dependent of the RF input power level. For example, a typical AM-PM distortion for a low power RF power amplifier in an ESA may be about 3-10 degrees/dB, which means every 1 dB change to an input signal would generate 3-10 degrees of phase distortion in the output of the RF power amplifier. At such a 3-10 degrees/dB distortion at saturation, a 0.5 dB change in the input would produce 1.5-5 degrees uncertainty in phase. Such phase uncertainty can broaden a beam width, thus reducing the beam pointing accuracy.

SUMMARY

In one aspect, embodiments of the inventive concepts disclosed herein are directed to a power amplifier including a power amplifier stage. The power amplifier stage may be configured to receive a signal, amplify the signal at saturation with substantially zero amplitude-phase (AM-PM) distortion, and output the amplified signal as an output signal. The power amplifier may be a single stage power amplifier or a multi-stage power amplifier.

In a further aspect, embodiments of the inventive concepts disclosed herein are directed to an electronically scanned array including antenna elements and a plurality of power amplifiers. The plurality of power amplifiers includes a power amplifier. Each of the plurality of power amplifiers may be coupled to one or more of the antenna elements. The power amplifier may comprise a power amplifier stage configured to receive a signal, amplify the signal at saturation with substantially zero AM-PM distortion, and output the amplified signal as an output signal.

In a further aspect, embodiments of the inventive concepts disclosed herein are directed to a method of operating a power amplifier. The method may include receiving a signal, amplifying, by a power amplifier, the signal at saturation with substantially zero AM-PM distortion, and outputting the amplified signal as an output signal.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
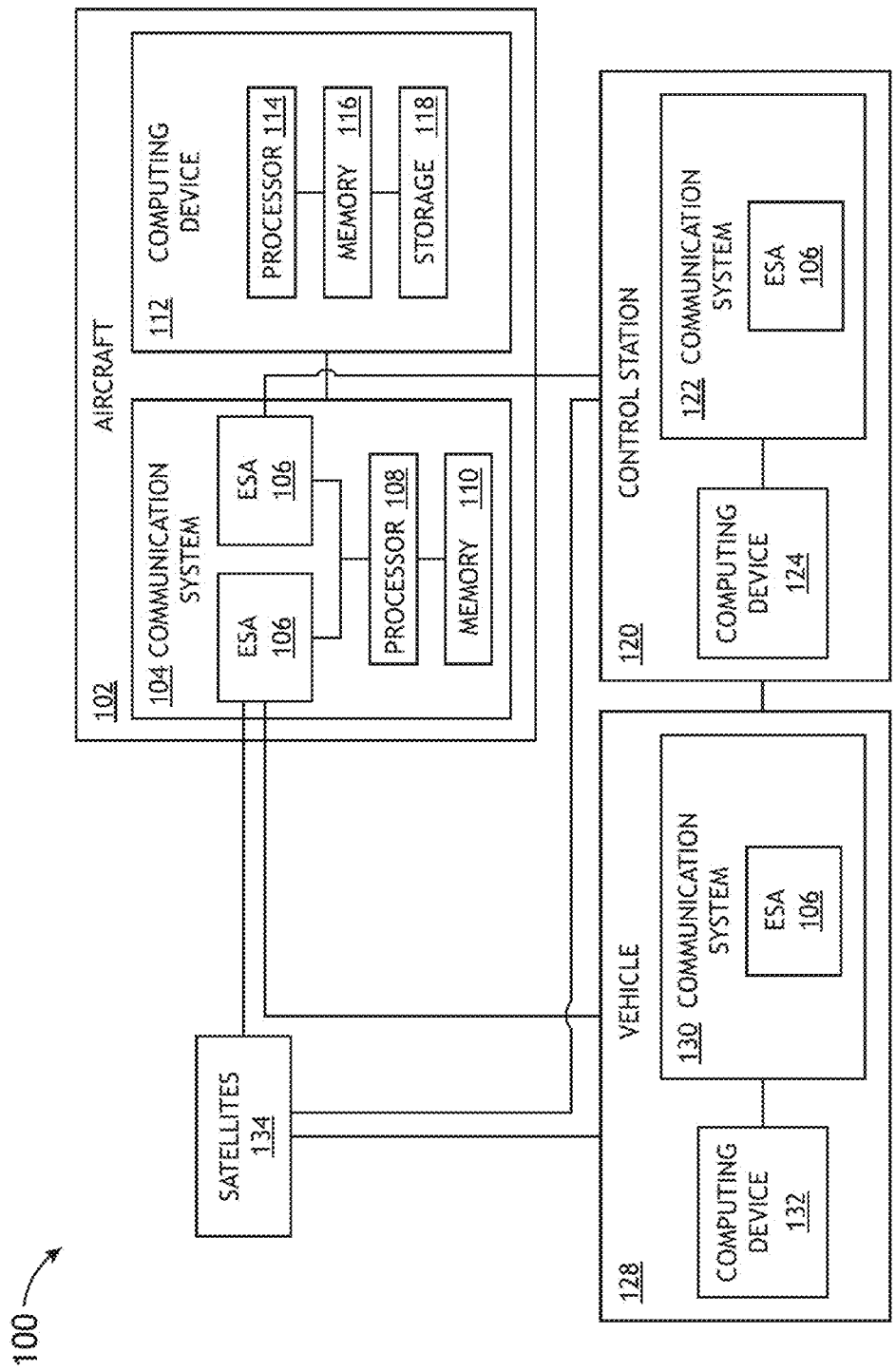
FIG. 1 is a view of an exemplary embodiment of a system according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to an ESA (such as an AESA) configured to operate with substantially zero AM-PM distortion in a linear region and substantially zero AM-PM distortion in a saturation region. Exemplary embodiments of the inventive concepts disclosed herein include an ESA including RF power amplifiers configured to operate at saturation with approximately zero AM-PM distortion, high RF power output, high PAE, and low amplitude-amplitude distortion ("AM-AM distortion", which may be a unitless metric (e.g., dB/dB) that quantifies a ratio of a change in the RF power amplifier's power output amplitude to a change in the RF power amplifier's power input amplitude). In exemplary embodiments, the phases of transmitted power (e.g., output power) from the RF power amplifiers may be insensitive to the RF input power driving each RF power amplifier at both peak power and tapered power, even if the phases are different by tens of degrees. Exemplary embodiments' phase insensitivity to the RF input power driving each RF power amplifier, at both peak power and tapered power, simplifies and facilitates ESA system configuration. Additionally, exemplary embodiments' phase insensitivity to the RF input power driving each RF power amplifier, at both peak power and tapered power, allows for significant reduction of time required to test and calibrate an ESA system.

Some embodiments of the inventive concepts disclosed herein are directed to an ESA (such as an AESA) configured to operate with substantially zero AM-PM distortion in a linear region and substantially zero AM-PM distortion in a saturation region. Embodiments may include power amplifiers (e.g., multi-stage power amplifiers) configured to operate with substantially zero AM-PM distortion in a linear region and substantially zero AM-PM distortion in a saturation region by utilizing self-biasing, active gate biasing, or a combination thereof.

Some embodiments may be implemented in AESA-based multi-function weather radar systems (e.g., next-generation commercial AESA-based multi-function weather radar systems). Some embodiments may be implemented in radar systems, such as radar systems for maritime surveillance, unmanned aerial system (UAS) detect and avoid, maritime rotary wing search and rescue, degraded visual environment (DVE) imaging, synthetic aperture radar (SAR), inverse synthetic aperture radar (ISAR), and frequency modulated continuous wave radar (FMCW radar). Some embodiments may be implemented in high data rate directional data link systems, such as for man packs, ground vehicles, maritime use, airborne use, satellite communications on the move (SOTM), or special operations. Some embodiments may be implemented in electronic attack systems, such as ultra-wide band (UWB) electronic attack (EA) jammers. Some embodiments may be implemented in anti-access area denial (A2AD) burn through jammer AESAs. Some embodiments may be implemented in any of suitable bandwidth AESA applications, such as narrow bandwidth, mid bandwidth, or wider bandwidth AESA applications (e.g., ultra-wide band radar applications).

Referring now to FIG. 1, an exemplary embodiment of a system 100 according to the inventive concepts disclosed herein includes at least one aircraft 102, a control station 120, at least one vehicle 128, and satellites 134. Some or all of the aircraft 102, the control station 120, the vehicle 128, and the satellites 134 may be communicatively coupled at any given time.

The aircraft 102 includes at least one communication system 104 and at least one computing device 112 (which may also be referred to as at least one aircraft computing device), as well as other systems, equipment, and devices commonly included in aircraft. Some or all of the communication system 104, the computing device 112, and other systems, equipment, and devices commonly included in aircraft may be communicatively coupled.

The communication system 104 includes two ESAs 106, a processor 108, and memory 110, which are communicatively coupled. The communication system 104 (such as via one or more of the ESAs 106) is configured to send and/or receive signals, data, messages, and/or voice transmissions to and/or from the control station 120, the vehicle 128, the satellites 134, and combinations thereof, as well as any other suitable devices, equipment, or systems. That is, the communication system 104 is configured to exchange (e.g., bi-directionally exchange) signals, data, messages, and/or voice communications with any other suitable communication system.

The communication system 104 may include at least one processor 108 configured to run various software applications or computer code stored in a non-transitory computer-readable medium (e.g., memory 110) and configured to execute various instructions or operations. For example, the processor 108 may be configured to receive data from the computing device 112 and execute instructions configured to cause a particular ESA of the ESAs 106 to transmit the data as a signal(s) to another communication system (e.g., 122 or 130) of the system 100. Likewise, for example, the processor 108 may be configured to route data received as a signal(s) by a particular ESA of the ESAs 106 to the computing device 112. The ESAs 106 may be implemented as described and illustrated in more detail with respect to FIGS. 2-8, below. For example, one or more of the ESAs 106 may be implemented as AESAs.

While the communication system 104 is shown as having two ESAs 106, one processor 108, and memory 110, the communication system 104 may include any suitable number of ESAs 106, processors 108, and memory 110. Further, the communication system 104 may include other components, such as a storage device (e.g., solid state drive or hard disk drive), radios (e.g., software defined radios (SDRs)), transmitters, receivers, transceivers, radio tuners, and controllers.

The computing device 112 of the aircraft 102 may include at least one processor 114, memory 116, and storage 118, as well as other components, equipment, and/or devices commonly included in a computing device, all of which may be communicatively coupled to one another. The computing device 112 may be configured to route data to the communication system 104 for transmission to an off-board destination (e.g., satellites 134, vehicle 128, control station 120). Likewise, the computing device 112 may be configured to receive data from the communication system 104 transmitted from off-board sources (e.g., satellites 134, vehicle 128, control station 120). The computing device 112 may include or be implemented as and/or be configured to perform the functionality of any suitable aircraft system, such as a flight management system. The processor 114 may be configured to run various software applications or computer code stored in a non-transitory computer-readable medium (e.g., memory 116 or storage 118) and configured to execute various instructions or operations. In some embodiments, the aircraft 102 may include any suitable number of computing devices 112.

The control station 120 includes at least one communication system 122 and at least one computing device 124, as well as other systems, equipment, and devices commonly included in a control station. Some or all of the communication system 122, the computing device 124, and other systems, equipment, and devices commonly included in a control system may be communicatively coupled. In one embodiment, the control station 120 may be implemented as a fixed location ground control station (e.g., a ground control station of an air traffic control tower, or a ground control station of a network operations center) or a mobile ground control station (e.g., a ground control station implemented on a non-airborne vehicle (e.g., an automobile or a ship) or a trailer). In some embodiments, the control station 120 is implemented as an air control station implemented on an airborne vehicle (e.g., aircraft).

The communication system 122 and components thereof (such as ESA 106) of the control station 120 may be implemented similarly to the communication system 104 except that, in some embodiments, the communication system 122 may be configured for operation at a fixed location. The computing device 124 and components thereof (such as a processor (not shown) and memory (not shown)) of the control station 120 may be implemented similarly to the computing device 112.

The vehicle 128 includes at least one communication system 130 and at least one computing device 132, as well as other systems, equipment, and devices commonly included in a vehicle. Some or all of the communication system 130, the computing device 132, and other systems, equipment, and devices commonly included in a vehicle may be communicatively coupled. The vehicle 128 may be implemented as any suitable type of vehicle, such as an automobile, aircraft, spacecraft, train, watercraft, or submersible craft. The communication system 130 and components thereof (such as ESA 106) of the vehicle 128 may be implemented similarly to the communication system 104 and the communication system 122. The computing device 132 and components thereof (such as a processor (not shown) and memory (not shown)) of the vehicle 128 may be implemented similarly to the computing device 112.

While the ESAs 106 are exemplarily depicted as being implemented in the aircraft 102, the control station 120, and the vehicle 128, in some embodiments, ESAs 106 may be implemented in, on, or coupled to any other suitable device, equipment, or system, such as a computing device (e.g., a laptop computing device, a mobile computing, a wearable computing device, or a smart phone), a mobile communication system (e.g., a man pack communication system), or satellites 134.

Figure 2:
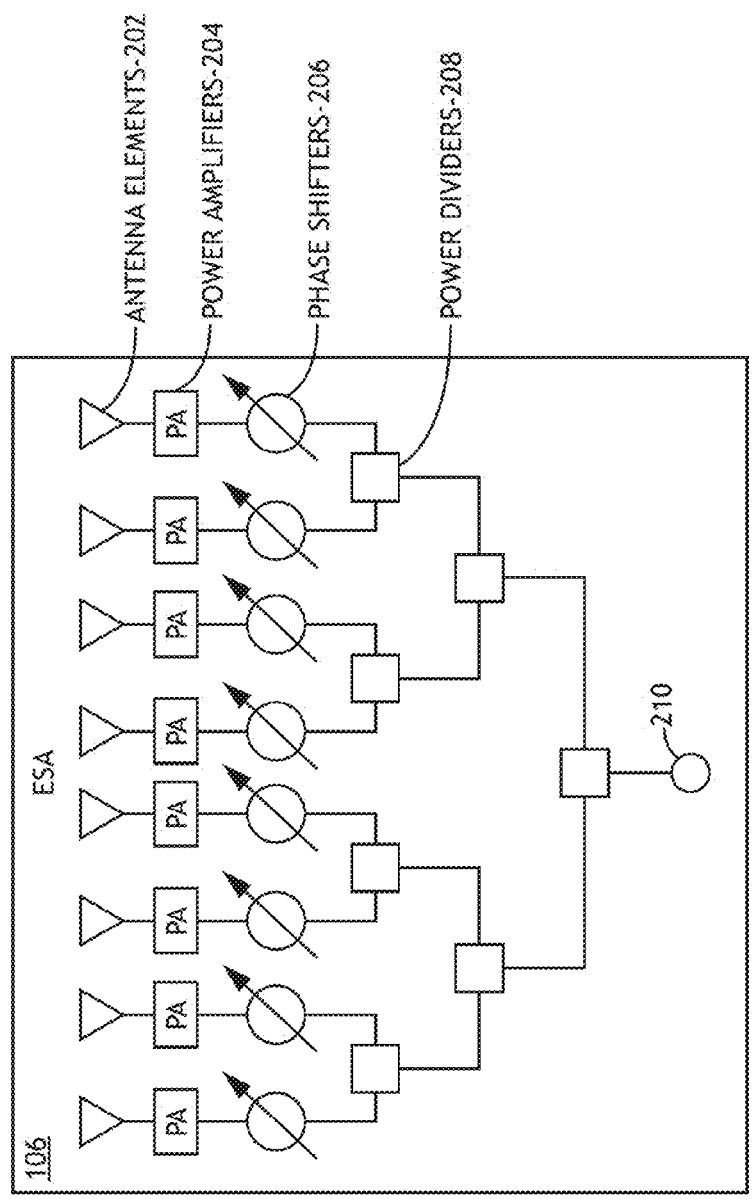
FIG. 2 is a view of an exemplary embodiment of one ESA of FIG. 1 according to the inventive concepts disclosed herein.

Referring now to FIG. 2, an exemplary embodiment of an ESA 106 according to the inventive concepts disclosed herein is shown. FIG. 2 shows components of the ESA 106 utilized for transmitting signals. While FIG. 2 does not show all of the components that might be implemented within the ESA 106 such as components that may be utilized for receiving signals, some embodiments may include any suitable components utilized for receiving and/or transmitting signals. In some embodiments, the ESA 106 is an AESA. The ESA 106 includes antenna elements 202 (e.g., radiating elements), power amplifiers 204, phase shifters 206, power dividers 208, and a signal source 210. The antenna elements 202 may receive a signal from a signal source 210, which generates a radio frequency signal to be emitted from the ESA 106 by antenna elements 202. For example, the signal source 210 may be a signal source, which receives input from the processor 108 or the processor 114. A power divider network 208 may divide the signal generated by the signal source 210 and route the divided signals to the antenna elements 202. Coupled between the antenna elements 202 and power divider network 208 are phase shifters 206 and power amplifiers 204. The phase shifters 206 may be configured to control the phase of the signals provided to the individual antenna elements 202 by power divider network 208. The power amplifiers 204 may be RF power amplifiers configured to control the RF transmit power of the signals provided to the individual antenna elements 202 by power divider network 208. In some embodiments, the phase shifters 206 are implemented as separate components or as part of separate components (e.g., implemented within a portion (e.g., a transmit/receive (T/R) radiofrequency integrated circuit (RFIC) 402, shown in FIG. 4A) of a T/R module (TRM) (e.g., TRM 308, such as an RFIC multi-chip TRM (which may be referred to as a multi-chip module (MCM))), which may be coupled to one or more antenna elements 202), which are not shown in FIG. 2. In some embodiments, the power amplifiers 204 are implemented as separate components or as part of separate components (e.g., implemented within at least one portion (e.g., at least one supporting T/R RFIC 404A, shown in FIG. 4A) of a TRM (e.g., TRM 308, TRM 404B), which may be coupled to one or more antenna elements 202).

In some embodiments, the ESA 106 is an AESA implemented as at least one hybrid T/R RF circuit module including multiple individual components, such as Gallium Arsenide (GaAs) power amplifiers (for example, associated with the transmit side), low noise amplifiers (for example, associated with the receive side), switches, or the like. For example, a hybrid transmit and receive assembly may provide both transmit and receive functionality for each antenna element 202 within an AESA. While a particular portion of an ESA 106's architecture of one embodiment is depicted in FIG. 2, other embodiments may be implemented with any suitable ESA or AESA architecture. For example, TRMs may be implemented as a single type of T/R RFICs (e.g., GaAs T/R RFICs, or other suitable T/R RFICs implemented with any suitable semiconductor material) or a combination of different types of T/R RFICs (e.g., GaAs T/R RFICs and a silicon germanium (SiGe) T/R RFIC, or any other suitable combination of different types of T/R RFICs implemented with any suitable semiconductor materials), as described in more detail below. Additionally, the TRMs may be implemented utilizing a single channel or any number of suitable channels, as described in more detail below.

The individual signals emitted by antenna elements 202 may combine to form an electronically steerable beam. Each power amplifier 204 may control the amplitude of the particular power amplifier's 204 respective signal to control a resulting shape of a beam and the beam's side lobes. In some embodiments, signals received via antenna elements 202 may be phase shifted by phase shifters 206 for further processing.

Additionally, in some embodiments for particular applications (e.g., broader bandwidth applications, such as ultra-wide band (UWB) applications), true-time delay units (TDUs) may be substituted for the phase shifters 206. For example, broader bandwidth applications may include UWB electronic attack jammers or other systems requiring UWB transmit capability. Additionally, AESAs suitable for use in UWB applications may include a balanced antipodal Vivaldi array (BAVA), a balanced antipodal asymmetric Vivaldi antenna array, a tapered slot antenna array, a balanced antipodal tapered slot antenna array, or other suitable aperture architecture.

Figure 3:
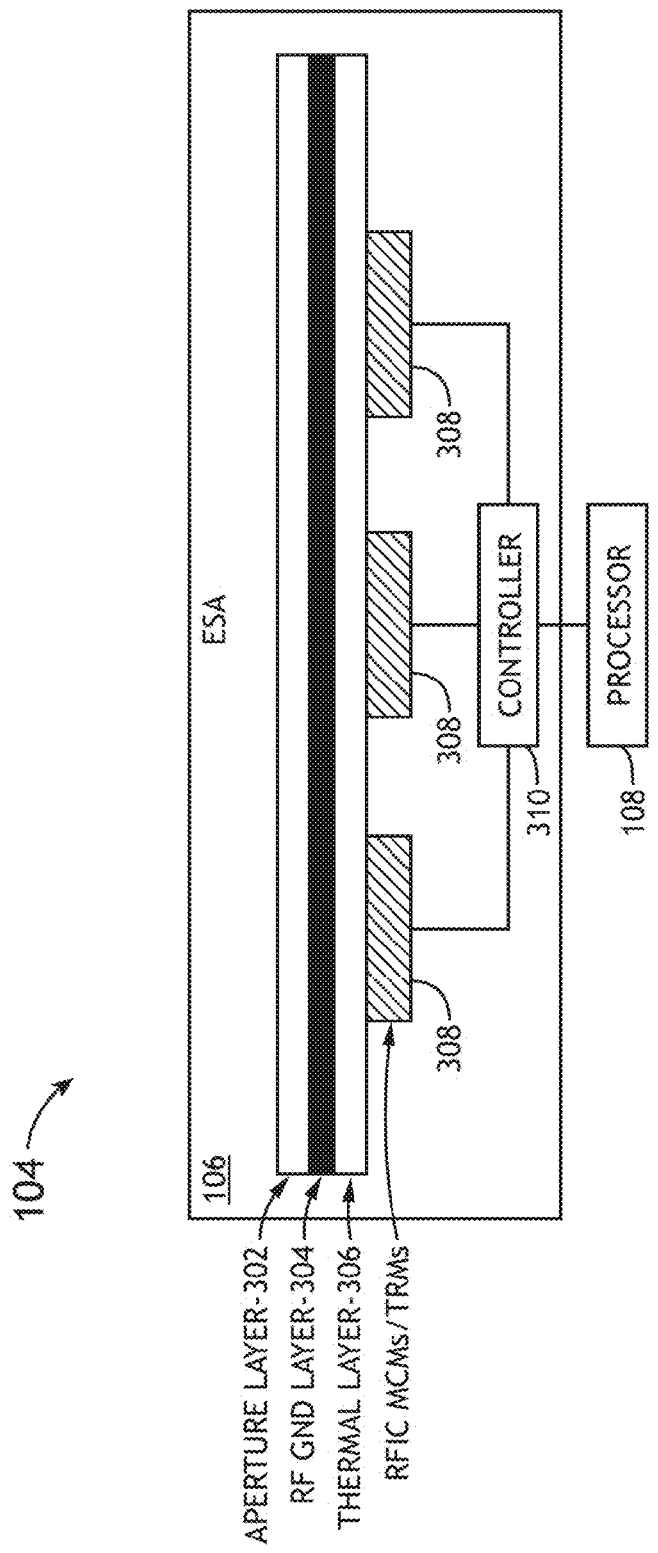
FIG. 3 is a cross-sectional view of an exemplary embodiment of a portion of the communication system of FIGS. 1-2 including an ESA coupled to a processor according to the inventive concepts disclosed herein.

Referring now to FIG. 3, an exemplary embodiment of a portion of the communication system 104 of FIG. 1 including one of the ESAs 106 coupled to the processor 108 according to the inventive concepts disclosed herein is shown.

The ESA 106 includes an aperture layer 302, an RF ground layer 304, a thermal layer 306, and a plurality of TRMs 308, as well as other components typical of ESAs, such as AESAs. The aperture layer 302 may include a plurality (e.g., tens, hundreds, thousands, or more) of antenna elements 202. The RF ground layer 304 is positioned between the aperture layer 302 and the thermal layer 306. The TRMs 308 may be implemented in or on (e.g., mounted to) a backside (e.g., a side of a printed circuit board opposite the aperture layer 302) of the ESA 106. In some embodiments, the TRMs 308 are RFIC MCMs. In other embodiments, each TRM 308 includes a plurality of T/R RFIC sub-systems integrated on a single integrated circuit chip or is implemented as or on a single integrated circuit chip.

The ESA 106 may include a controller 310 configured to monitor, control, and synchronize operation of the TRMs 308 of the ESA 106. For example, the controller may be coupled to the processor 108 (which may be implemented as or as a part of a radio or other signal source) and each of the TRMs 308. For example, the controller 310 may be coupled to one or more power amplifiers 204 and one or more associated phase detectors (e.g., phase detector 518, as shown in FIG. 5) of each TRM 308. The controller 310 may be configured to determine a phase of each power amplifier's 204 output based on received feedback from the phase detector 518. In some embodiments, the controller 310 as, in, or on an RFIC (e.g., RFIC 402 or RFIC 404A, as shown in FIG. 4A).

Additionally, the controller 310 may be configured to apply one or more bias voltages to one or more stages (e.g., first stage 506, second stage 510, and third stage 514, as shown in FIG. 5) of each power amplifier 204 and/or to control the one or more bias voltages applied to the one or more stages. The controller 310 may be configured to apply one or more bias voltages to a terminal (e.g., a gate) of one or more transistors (e.g., 608, 708, 808) of each stage of each power amplifier 204. For example, the controller 310 may be configured to apply a bias voltage to a gate of a transistor (e.g., 608, 708, or 808) of each stage (e.g., first stage 506, second stage 510, and third stage 514) of a power amplifier 204. For example, by applying a bias voltage to the gate of a final stage (e.g., the third stage 514), the power amplifier 204 may be configured to operate at saturation with substantially zero AM-PM distortion, such that the power amplifier 204 has at least two substantially zero AM-PM distortion regions (e.g., at saturation and at a linear region). In some embodiments, the controller 310 is configured to adaptively determine a variable bias to apply and apply the determined bias at least based on at least one of PAE, power output, power input, power output phase, and phase change.

While controller 310 and processor 108 are depicted and described as separate components in an exemplary embodiment, in some embodiments, the processor 108 may be configured to have the connectivity of the controller 310 and to perform the functionality of the controller 310. In some embodiments, the controller 310 may be implemented as a plurality of controllers each configured to apply one or more bias voltages and/or to control the one or more bias voltages applied associated with one or a group of power amplifiers 204.

Figure 4A:
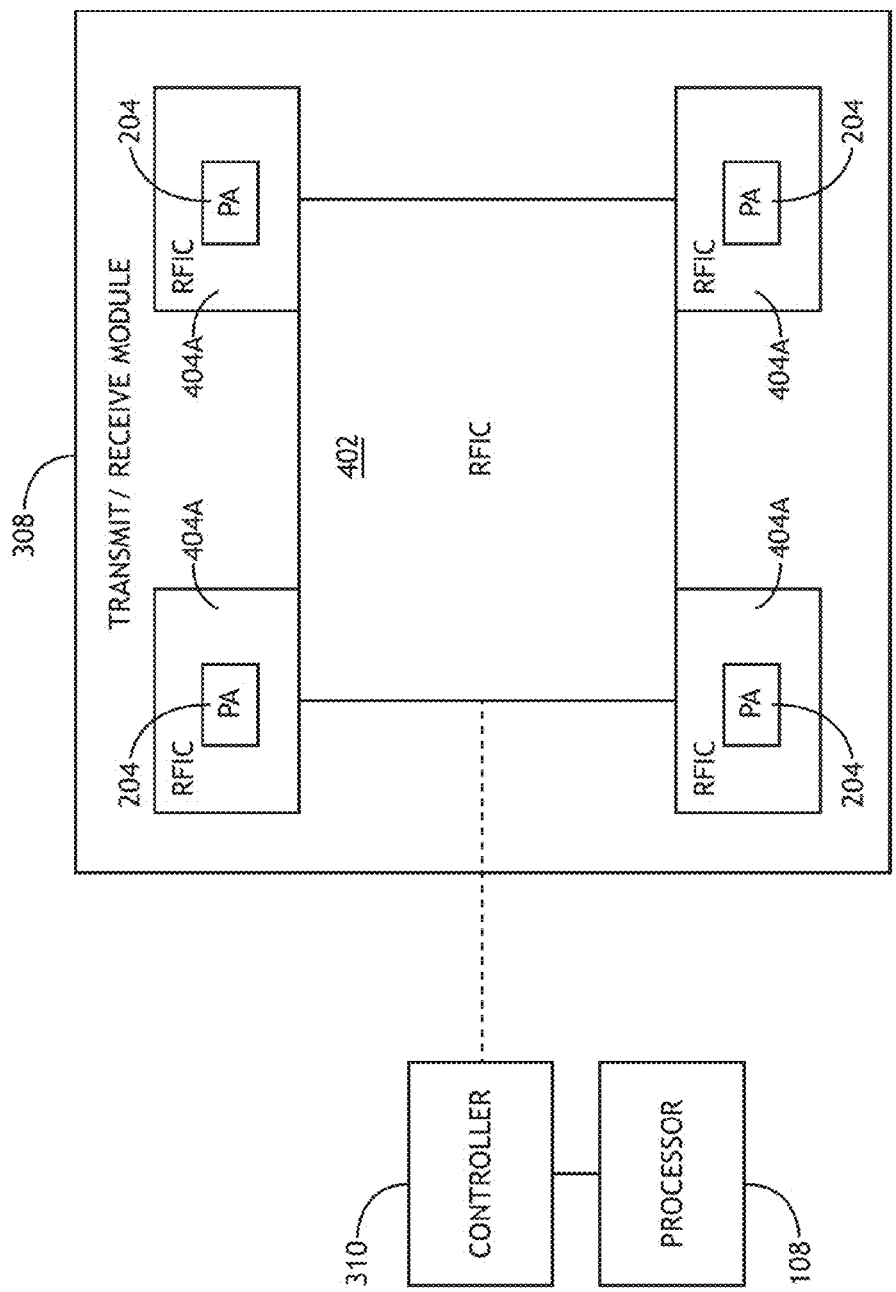
FIG. 4A is a bottom view of an exemplary embodiment of one four-channel transmit/receive module of FIG. 3 according to the inventive concepts disclosed herein.
Figure 4B:
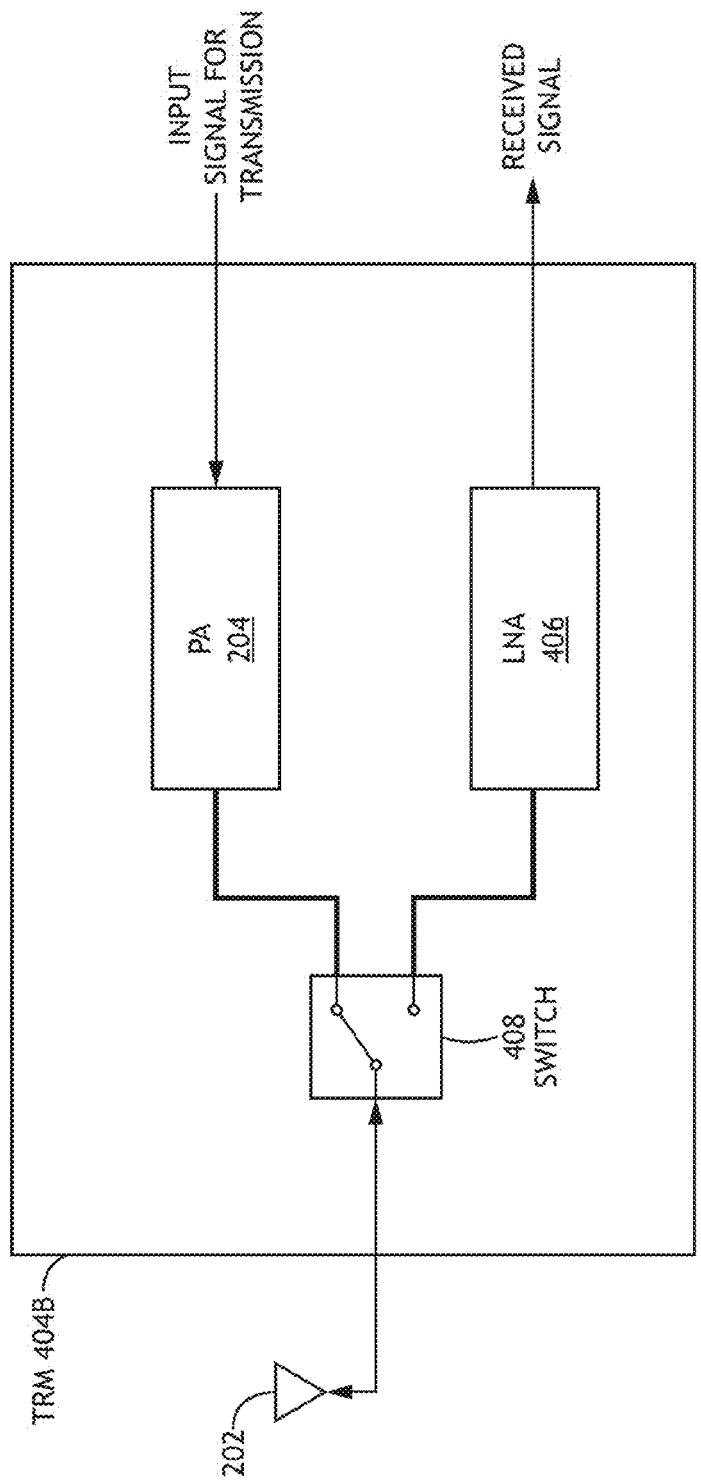
FIG. 4B is an exemplary embodiment of a portion of an ESA similar to FIG. 4A.
Figure 5:
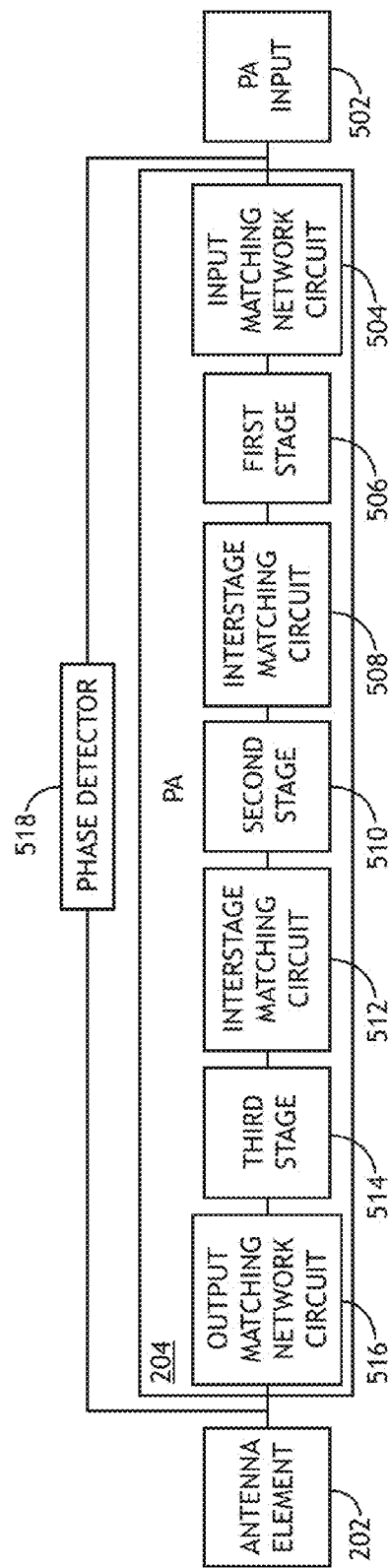
FIG. 5 is a view of an exemplary embodiment of a portion of the ESA of FIG. 4A according to the inventive concepts disclosed herein.

Referring now to FIG. 4A, an exemplary embodiment of a four-channel TRM 308 of FIG. 3 coupled to the controller 310 and the processor 108 according to the inventive concepts disclosed herein is shown. The four-channel TRM 308 may be implemented as an AESA unit cell including multiple TRMs, for example, which may be implemented as RFICs 404A or TRM 404B (as shown in FIG. 4B). Each of the RFICs 404A may be coupled to a common RFIC 402. The RFIC 402 may be coupled to the controller 310 and the processor 108. For example, the RFIC 402 may be a SiGe T/R RFIC, and each of the RFICs 404A may be GaAs T/R RFICs. While the TRM 308 is exemplarily depicted as a four-channel TRM, some embodiments may include a single channel TRM or multi-channel TRM configured for any suitable number of channels.

As shown in FIG. 4A, the TRM 308 may include one T/R RFIC 402 and at least one power amplifier 204 implemented in each of four supporting T/R RFICs 404A. In an exemplary embodiment, each T/R RFIC 402 is a SiGe T/R RFIC, and each a supporting T/R RFIC 404A is a GaAs T/R RFIC. Each T/R RFIC 402 works in concert with at least one supporting T/R RFIC 404A. The power amplifier 204 of each supporting T/R RFIC 404A is configured to increase (e.g., amplify) RF transmit power levels higher than would be possible with the T/R RFIC 402, alone. Additionally, the receive side circuitry of each supporting T/R RFIC 812 reduces a noise figure to levels lower than the capability of the T/R RFIC 811, alone. For example, the T/R RFIC 811 may be a main T/R RFIC of the T/R module 810, and each supporting T/R RFIC 812 may be a secondary T/R RFIC configured to enhance performance of the main T/R RFIC. While an exemplary embodiment is depicted and described with respect to the TRM 308 including one RFIC 402 and four RFICs 404A, in some embodiments, the TRM 308 may be implemented as having any suitable number of RFICs 402 and RFICs 404A. Additionally, while each of the RFICs 404A are exemplarily depicted as including one power amplifier 204, each of the RFICs 404A may include any suitable number of power amplifiers 204.

Each of the power amplifiers 204 may be implemented in a particular RFIC 404A, which may be coupled to the RFIC 402. Each of the power amplifiers 204 of a supporting T/R RFIC 404A may be coupled to and/or configured to provide power to an associated antenna element 202 of the ESA 106 such that the associated antenna element 202 outputs a signal having a particular transmitted power (as well as other RF signal characteristics, such as phase, PAE, polarization, frequency, or the like).

In one embodiment, the RFIC 402 of the TRM 308 is a four-channel SiGe T/R RFIC, and each of the RFICs 404A is a GaAs RFIC, which each includes a power amplifier 204. The RFIC 402 may receive instructions from the controller 310 and/or the processor 108 for how to adjust an input power, a gate bias voltage, or the like for the power amplifier 204 of each of the four RFICs 404A. Based on the instructions received from the processor 108 and/or the controller 310, the RFIC 402 may provide input power to each of the four RFICs 404A and may apply a gate bias voltage to each power amplifier 204 of the four RFICs 404A. On the other hand, in some embodiments, each of the RFICs 404A may receive instructions from the controller 310, the processor 108, and/or the RFIC 402 for how to adjust an input power, a gate bias voltage, or the like for each associated power amplifier 204 of the particular RFIC 404A. Based on the instructions received from the processor 108, the controller 310, and/or RFIC 402, the RFIC 404A may provide input power to and may apply a gate bias voltage to the particular power amplifier 204 of the particular RFIC 404A.

For example, the RFIC 402 may provide gate bias voltage and/or current outputs to each of the four RFICs 404A, each of which includes a power amplifier 204. The four RFICs 404A (which include the power amplifiers 204) may be required to achieve higher power amplifier output power and lower noise figures than the RFIC 402 can provide alone. In one embodiment, the RFIC 402 provides a variable input drive power to the four RFICs 404A by utilizing one or more variable gain amplifiers (VGAs). In one embodiment, the RFIC 402 provides both gate bias voltages and variable power inputs to the power amplifiers 204. The TRMs 308 may be implemented in any suitable ESA system, such as a weather radar AESA system.

In one embodiment, the RFIC 402 includes eight VGAs, eight phase shifters 206, four RF detectors, 32 digital-to-analog converters (DACs), four analog-to-digital converters (ADCs), 2 RF combiners (e.g., reversed power dividers (e.g., 208)), redundant serial peripheral interface (SPI) buses, RF power sensors, and temperature sensors. In one embodiment, the temperature and power sensors of the RFIC 402 allow for calibration, built-in self-test (BIST), and self-healing. In one embodiment, the RFIC 402 is configured for cyclic redundancy check (CRC) monitoring to provide real-time diagnostics and/or graceful degradation. In one embodiment, the phase shifters 206 of the RFIC 402 are 10-bit phase shifters, and the VGAs of the RFIC 402 are 30 dB VGAs. In one embodiment, the phase shifters 206 and the VGAs of the RFIC 402 provide for low side lobe levels, dynamic pattern synthesis, and self-calibration. While one exemplary embodiment includes one RFIC 402 implemented as a four-channel SiGe T/R RFIC including particular elements and a particular number of the particular elements, other embodiments may include any suitable number of TRMs including any suitable number of RFICs 402, where each RFIC 402 includes any suitable elements, any suitable number of such suitable elements, in any suitable arrangement. Further, while one exemplary embodiment includes an RFIC 402 implemented as a four-channel SiGe T/R RFIC, in other embodiments RFIC 402 may be implemented for any number of suitable channels (e.g., one, two, three, four, five, six, seven, eight, nine, or more channels) and by utilizing any suitable semiconductor material (e.g., gallium nitride (GaN), or GaAs). While in one embodiment each of the at least one supporting RFIC 404A is implemented as a GaAs T/R RFIC, in other embodiments the at least one supporting RFIC 404A may be implemented by utilizing any suitable semiconductor material (e.g., GaN, or SiGe).

While an exemplary ESA configuration is depicted and described with respect to FIG. 4A, an ESA 106 may be implemented utilizing any suitable ESA architecture.

Referring now to FIG. 4B, an exemplary embodiment of a portion of the ESA 106 according to the inventive concepts disclosed herein is shown. A TRM 404B may be implemented and function similarly to the RFIC 404A described above with respect to FIG. 4A, except that the TRM 404B may be implemented as a single RFIC (e.g., RFIC 404A), an MCM, or a combination of suitable electronic components. That is, for example, RFIC 404A is an exemplary, but not limiting, implementation of the TRM 404B. The TRM 404B may include the power amplifier 204, a low noise amplifier (LNA) 406, and a switch 408. For example, the switch 408 may be implemented as a single pole double terminal (SPDT) switch. The switch 408 may be configured to allow the TRM 404B to operate in one of a transmit mode or a receive mode at any given time by switching open and closed electrical circuitry between the antenna element 202 and the power amplifier 204 and between the antenna element 202 and the LNA 406, respectively.

When operating in a transmit mode, the power amplifier 204 may be implemented and function similarly as disclosed throughout. When the TRM 404B is being operated in a transmit mode, the power amplifier 204 may receive an input signal for transmission, and the power amplifier 204 may amplify the signal and output the amplified signal through the switch 408 to the antenna element 202.

When operating in a receive mode, the antenna element 202 may receive a signal (e.g., from some other transmitter) and output the signal through the switch 408 to the LNA 406. The LNA 406 is configured to receive the signal and amplify the signal for output to another electronic component.

Referring now to FIG. 5, an exemplary embodiment of a portion of the ESA 106 according to the inventive concepts disclosed herein is shown. Each power amplifier 204 may receive an RF power input from a power amplifier input 502 (e.g., RFIC 402, RFIC 404A, or TRM 404B). Each power amplifier 204 may provide amplified power to a particular antenna element 202.

The power amplifier 204 may include one or more stages (e.g., first stage 506, second stage 510, and third stage 514) and one or more matching circuits (e.g., input matching network circuit 504, inter-stage matching circuit 508, inter-stage matching circuit 512, and output matching network circuit 516). For example, as shown in FIG. 5, the power amplifier 204 may include an input matching network circuit 504, a first stage 506, an inter-stage matching circuit 508, a second stage 510, an inter-stage matching circuit 512, a third stage 514, and an output matching network circuit 516. For example, the input matching network circuit 504, the first stage 506, the inter-stage matching circuit 508, the second stage 510, the inter-stage matching circuit 512, the third stage 514, and the output matching network circuit 516 may be coupled to one another at least partially in series.

While the power amplifier 204 is depicted as having three stages, the power amplifier 204 may be implemented with a single stage or any suitable number of stages. Though each of the three stages (i.e., 506, 510, 514) of the exemplary power amplifier 204 depicted in FIG. 5 have been referred to as "first stage", "second stage", and "third stage", respectively, it will be appreciated that each of the first stage 506, the second stage 510, and the third stage 514 may be referred to using different terminology, such as may be suitable for describing single or multi-stage power amplifiers that are not three-stage power amplifiers. For example, the first stage 506 may be referred to as an initial power amplifier stage or a pre-final power amplifier stage, the second stage 510 may be referred to as an intermediate power amplifier stage or a pre-final power amplifier stage, and the third stage 514 may be referred to as a final power amplifier stage.

The input matching network circuit 504 may be configured to receive a signal from the power amplifier input 502 and perform signal matching operations, such as impedance matching, on the signal and output the signal to the first stage 506. The input matching network circuit 504 may include one or more resistors and one or more capacitors.

The first stage 506 may be a power amplifier stage that is configured to amplify the signal received from the input matching network circuit 504 and output the amplified signal to the inter-stage matching circuit 508. In some embodiments, the first stage 506 may be operated in the linear region such that there is substantially zero AM-PM distortion at the first stage 506. That is, when operating the first stage 506 in the linear region, a phase of the first stage's 506 output remains relatively constant, and the first stage's 506 RF output amplitude increases proportionally to an increase in RF power input; however, in other embodiments the first stage 506 may be operated at compression, for example, to improve efficiency (e.g., PAE).

The inter-stage matching circuit 508 may be configured to receive a signal from the first stage 506 and perform signal matching operations, such as impedance matching, on the signal and output the signal to the second stage 510. The inter-stage matching circuit 508 may include one or more resistors and one or more capacitors.

The second stage 510 may be a power amplifier stage that is configured to amplify the signal received from the inter-stage matching circuit 508 and output the amplified signal to the inter-stage matching circuit 512. In some embodiments, the second stage 510 may be operated in the linear region such that there is substantially zero AM-PM distortion at the second stage 510. That is, when operating the second stage 510 in the linear region, a phase of the second stage's 510 output remains relatively constant, and the second stage's 510 RF output amplitude increases proportionally to an increase in RF power input; however, in other embodiments the second stage 510 may be operated at compression, for example, to improve efficiency (e.g., PAE).

The inter-stage matching circuit 512 may be configured to receive a signal from the second stage 510 and perform signal matching operations, such as impedance matching, on the signal and output the signal to the third stage 514. The inter-stage matching circuit 512 may include one or more resistors and one or more capacitors.

The third stage 514 may be a power amplifier stage that is configured to amplify the signal received from the inter-stage matching circuit 512 and output the amplified signal to the output matching network circuit 516. In an exemplary embodiment, the third stage 514 may be configured to operate in a linear region with substantially zero AM-PM distortion and operate at saturation with substantially zero AM-PM distortion.

The output matching network circuit 516 may be configured to receive a signal from the third stage 514 and perform signal matching operations, such as impedance matching, on the signal and output the signal to the antenna element 202. The output matching network circuit 516 may include one or more resistors and one or more capacitors.

While an exemplary embodiment is depicted of the power amplifier 204 as including three power amplifier stages (e.g., first stage 506, second stage 510, and third stage 514), the power amplifier 204 may be implemented as including any suitable number of stages, such as one, two, three, four, five, . . . , 16, or more stages.

Additionally, the ESA 106 may include a plurality of phase detectors (e.g., phase detector 518). The phase detector 518 may be utilized in embodiments including power amplifiers configured to operate with substantially zero AM-PM distortion in a linear region and substantially zero AM-PM distortion in a saturation region by utilizing active gate biasing. On the other hand, the phase detector 518 may be omitted in embodiments that include power amplifiers configured to operate with substantially zero AM-PM distortion in a linear region and substantially zero AM-PM distortion in a saturation region by utilizing self-biasing. For example, a phase detector 518 may be configured to determine a phase change between a phase of the power amplifier's 204 output and a phase of the power amplifier's 204 input. The phase detector 518 may also be communicatively coupled to the controller 310, processor 108, the RFIC 402, a particular RFIC 404A, or any other suitable component of or associated with the ESA 106 such that the phase detector is configured to provide phase feedback to such suitable components. While the phase detector 518 is exemplarily depicted as being configured to determine (e.g., measure, such as by comparing) the phase change between the input and output of the power amplifier 204, some embodiments may include one or more phase detectors configured to measure the phase change between the input and output of one or more individual stages (e.g., first stage 506, second stage 510, and third stage 514) of the power amplifier 204.

Figure 6:
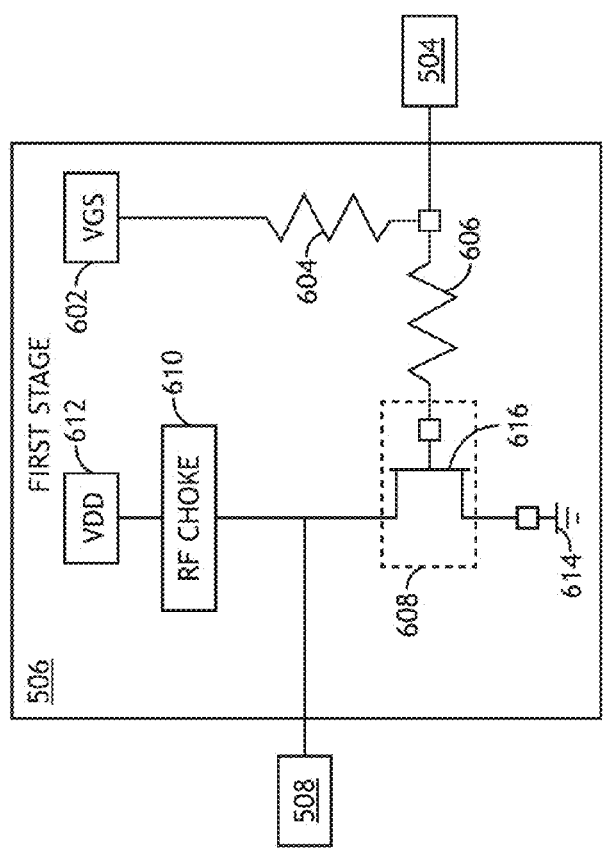
FIG. 6 is a view of an exemplary embodiment of the first stage of FIG. 5 according to the inventive concepts disclosed herein.

Referring now to FIG. 6, an exemplary embodiment of the first stage 506 of FIG. 5 is shown according to the inventive concepts disclosed herein. The first stage 506 may include a gate bias voltage line 602, a first gate bias resistor assembly 604, a second gate bias resistor assembly 606, a transistor 608, an RF choke 610, and a voltage supply line 612. Additionally, the first stage 506 may include additional electronic components, such as capacitors, other resistors, other transistors, or the like. The first stage 506 is configured to amplify the signal received from the input matching network circuit 504 and output the amplified signal to the inter-stage matching circuit 508. In an exemplary embodiment, the first stage 506 may be operated in the linear region such that there is substantially zero AM-PM distortion at the first stage 506.

The gate bias voltage line 602 is configured to be biased with a gate bias voltage (e.g., gate to source voltage, $V_{GS}$). The gate bias voltage may be applied to the gate bias voltage line 602 by any suitable component of the ESA 106, such as the RFIC 402, the RFIC 404A, the TRM 404B, or the controller 310. In an exemplary embodiment, the RFIC 402, RFIC 404A, or TRM 404B may apply a negative bias voltage to the gate bias voltage line 602 such that the gate bias voltage is applied to the gate 616 of the transistor 608 (through and subject to the effects of the first gate bias resistor assembly 604 and the second gate bias resistor assembly 606).

The first gate bias resistor assembly 604 may include one or more resistors that have a particular aggregate resistance. The first gate bias resistor assembly 604 may be implemented on the gate bias voltage line 602. For example, the first gate bias resistor assembly 506 may be implemented as one resistor that has a particular resistance.

The second gate bias resistor assembly 606 may include one or more resistors that have a particular aggregate resistance. The second gate bias resistor assembly 606 may be implemented on the gate bias voltage line 602 between the gate 616 and junction between the input matching network 504 and the first gate bias resistor assembly 604. For example, the first gate bias resistor assembly 506 may be implemented as one resistor that has a particular resistance. In an exemplary embodiment, the second gate bias resistor assembly 606 may have a resistance of approximately 5.1 ohms (e.g., +/−0.5 ohms); however, some embodiments may include the second gate bias resistor assembly 606 as having any suitable resistance.

The transistor 608 may include three or more terminals, including a gate 616 and a bulk 614 (sometimes referred to as a body, base, or substrate). The input matching network circuit 504 may act as a source terminal, and the inter-stage matching network 508 may act as a drain terminal. The signal from the power amplifier input 502 (e.g., via the input matching network circuit 504) may be input to the gate 616, and the output signal may be output from the transistor 608 to the inter-stage matching circuit 508. In an exemplary embodiment, the transistor 608 is a field-effect transistor (FET), such as a common source FET; however, in some embodiments, the transistor 608 may be implemented as another suitable transistor, such as a metal-semiconductor FET (MESFET), high-electron-mobility transistor (HEMT), pseudomorphic HEMT (pHEMT), silicon (Si) junction gate FET (JFET), or piezoelectric transistor (PET).

A voltage (e.g., a positive voltage supply, $V_{DD}$) may be applied to the voltage supply line 612. The voltage supply line 612 may be connected to an electrical line between the inter-stage matching circuit 508 and the transistor 608. The voltage supply line 612 may include an RF choke 610. In an exemplary embodiment, a positive voltage supply may be applied, via the voltage supply line 612, to the output side of the transistor 608 by any suitable component of the ESA 106, such as the RFIC 402, the RFIC 404A, TRM 404B, or the controller 310. In an exemplary embodiment, the RFIC 402, RFIC 404A, or TRM 404B may apply a positive supply voltage to the voltage supply line 612 such that the positive supply voltage is applied to the output side of the gate 616 of the transistor 608 (through and subject to the effects of the RF choke 610).

Figure 7:
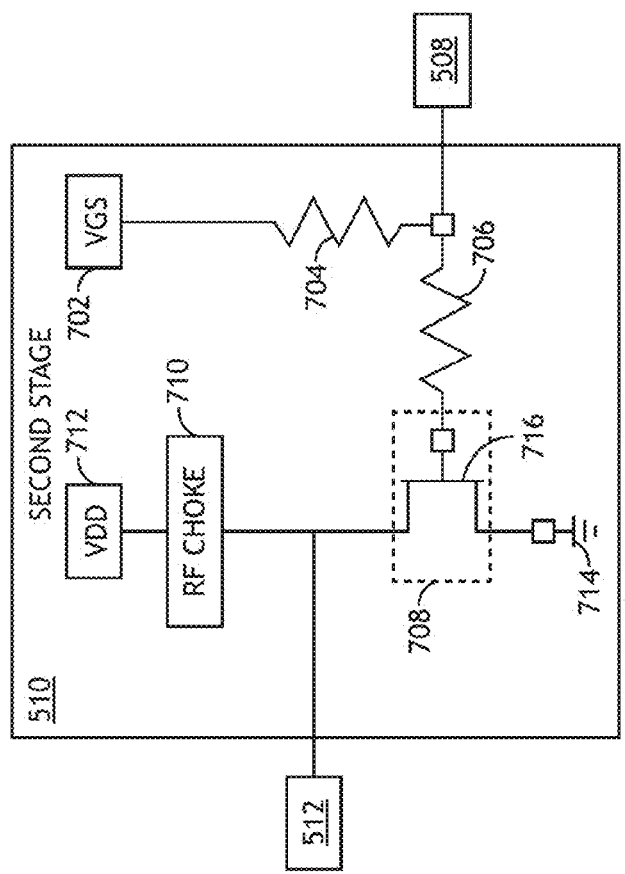
FIG. 7 is a view of an exemplary embodiment of the second stage of FIG. 5 according to the inventive concepts disclosed herein.

Referring now to FIG. 7, an exemplary embodiment of the second stage 510 of FIG. 5 is shown according to the inventive concepts disclosed herein. The second stage 510 may include a gate bias voltage line 702, a first gate bias resistor assembly 704, a second gate bias resistor assembly 706, a transistor 708, an RF choke 710, and a voltage supply line 712. Additionally, the second stage 510 may include additional electronic components, such as capacitors, other resistors, other transistors, or the like. The second stage 510 is configured to amplify the signal received from the inter-stage matching circuit 508 and output the amplified signal to the inter-stage matching circuit 512. In an exemplary embodiment, the second stage 510 may be operated in the linear region such that there is substantially zero AM-PM distortion at the second stage 510.

The gate bias voltage line 702 may be implemented and function similarly to the gate bias voltage line 602 described above with respect to FIG. 6, except that the gate bias voltage applied to the gate bias voltage line 702 may be the same as or different from the gate bias voltage applied to the gate bias voltage line 602.

The first gate bias resistor assembly 704 may be implemented and function similarly to the first gate bias resistor assembly 604 described above with respect to FIG. 6, except that the first gate bias resistor assembly 704 may have the same or different resistance as compared to the first gate bias resistor assembly 604 of the first stage 506. For example, the first gate bias resistor assembly 704 may have a resistance of approximately 573.3 ohms (e.g., +/−50 ohms); however, some embodiments may include the first gate bias resistor assembly 704 as having any suitable resistance.

The second gate bias resistor assembly 706 may be implemented and function similarly to the second gate bias resistor assembly 606 described above with respect to FIG. 6, except that the second gate bias resistor assembly 706 may have the same or different resistance as compared to the second gate bias resistor assembly 606 of the first stage 506. In an exemplary embodiment, the second gate bias resistor assembly 706 may have a resistance of approximately 13 ohms (e.g., +1-1.0 ohm); however, some embodiments may include the second gate bias resistor assembly 706 as having any suitable resistance.

The transistor 708 (including gate 716 and bulk 714) may be implemented and function similarly to the transistor 608 (including gate 616 and bulk 614) described above with respect to FIG. 6, except that inter-stage matching circuit 508 may act as the source terminal, and the inter-stage matching circuit 512 may act as the drain terminal. Additionally, the transistor 708 may be implemented as the same type as or a different type from the transistor 608. Further, the gate 716 of the transistor 708 may have the same or different properties from the gate 616 of the transistor 608.

The voltage supply line 712 may be implemented and function similarly to the voltage supply line 612 described above with respect to FIG. 6, except that the supply voltage applied to the voltage supply line 712 may be the same as or different from the supply voltage applied to the voltage supply line 612. The RF choke 710 may be implemented and function similarly to the RF choke 610 described above with respect to FIG. 6, except that the RF choke 710 may have the same or different electrical properties from the RF choke 610.

Figure 8:
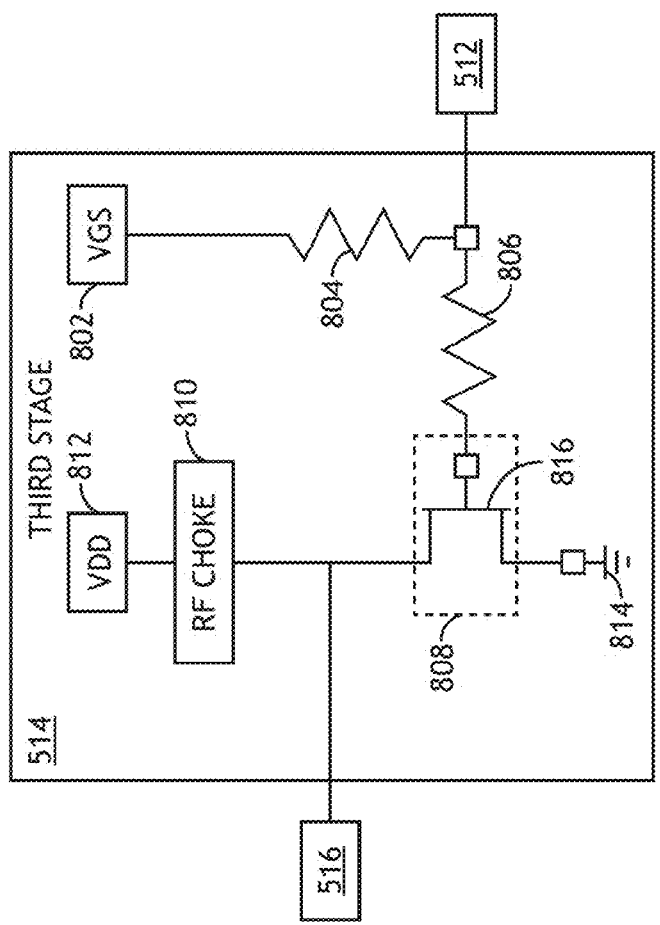
FIG. 8 is a view of an exemplary embodiment of the third stage of FIG. 5 according to the inventive concepts disclosed herein.

Referring now to FIG. 8, an exemplary embodiment of the third stage 514 of FIG. 5 is shown according to the inventive concepts disclosed herein. The third stage 514 may include a gate bias voltage line 802, a first gate bias resistor assembly 804, a second gate bias resistor assembly 806, a transistor 808, an RF choke 810, and a voltage supply line 812. Additionally, the third stage 514 may include additional electronic components, such as capacitors, other resistors, other transistors, or the like. The third stage 514 is configured to amplify the signal received from the inter-stage matching circuit 512 and output the amplified signal to the output matching network circuit 516. In an exemplary embodiment, the third stage 514 may be operated in saturation with substantially zero AM-PM distortion. The gate bias voltage line 802 may be implemented and function similarly to the gate bias voltage lines 602, 702 described above with respect to FIGS. 6-7, except that the gate bias voltage applied to the gate bias voltage line 802 may be the same as or different from one of the gate bias voltages applied to the gate bias voltage lines 602, 702. In some embodiments, a constant gate bias voltage may be applied to the gate bias voltage line 802, such as may be suitable for embodiments configured for self-biasing. On the other hand, in some embodiments, a variable gate bias voltage may be applied to the gate bias voltage line 802, such as may be suitable for embodiments configured for active gate biasing.

In some embodiments, the third stage 514 may be configured to operate with substantially zero AM-PM distortion at saturation through self-biasing, active gate biasing, or combination thereof.

The first gate bias resistor assembly 804 may be implemented and function similarly to the first gate bias resistor assembly 604, 704 described above with respect to FIGS. 6-7, except that the first gate bias resistor assembly 804 may have the same or different resistance as compared to the first gate bias resistor assembly 604, 704. For example, the first gate bias resistor assembly 804 may have a resistance of approximately 379 ohms (e.g., +/−40 ohms); however, some embodiments may include the first gate bias resistor assembly 804 as having any suitable resistance.

The second gate bias resistor assembly 806 may be implemented and function similarly to the second gate bias resistor assembly 606, 706 described above with respect to FIGS. 6-7, except that the second gate bias resistor assembly 806 may have the same or different resistance as compared to one of the second gate bias resistor assembly 606, 706. In an exemplary embodiment, the second gate bias resistor assembly 806 may have a resistance of approximately 3.6 ohms (e.g., +/−0.4 ohms); however, some embodiments may include the second gate bias resistor assembly 806 as having any suitable resistance.

In some embodiments, the third stage 514 may be configured to operate with substantially zero AM-PM distortion at saturation through self-biasing based on the resistance of the first gate bias resistor assembly 804 and the resistance of the second gate bias resistor assembly 806. That is, the gate 816 of the transistor 808 of the third stage 514 may be biased by implementing the first gate bias resistor assembly 804 as having a first resistance and the second gate bias resistor assembly 806 as having a second resistance such that a relationship of the first resistance to the second resistance allows the the third stage 514 to achieve substantially zero AM-PM distortion at saturation.

The transistor 808 (including gate 816 and bulk 814) may be implemented and function similarly to the transistor 608 (including gate 616 and bulk 614), 708 (including gate 716 and bulk 714) described above with respect to FIGS. 6-7, except that inter-stage matching circuit 512 may act as the source terminal, and the output matching network circuit 516 may act as the drain terminal. Additionally, the transistor 808 may be implemented as the same type as or a different type from one of the transistors 608, 708. Further, the gate 816 of the transistor 808 may have the same or different properties from one of the gates 616, 716.

The voltage supply line 812 may be implemented and function similarly to the voltage supply line 612, 712 described above with respect to FIGS. 6-7, except that the supply voltage applied to the voltage supply line 812 may be the same as or different from one of the supply voltages applied to one of the voltage supply lines 612, 712. The RF choke 810 may be implemented and function similarly to the RF choke 610, 710 described above with respect to FIGS. 6-7, except that the RF choke 810 may have the same or different electrical properties from the RF choke 610, 710.

Some embodiments may be configured for self-biasing such that the gate 816 of the transistor 808 of the third stage 514 is biased by implementing the first gate bias resistor assembly 804 as having a first resistance and the second gate bias resistor assembly 806 as having a second resistance. As such, a relationship between the first resistance and the second resistance allows the third stage 514 to achieve substantially zero AM-PM distortion at saturation.

On the other hand, some embodiments may be configured for active gate biasing. When operating the third stage 514 of the power amplifier 204 at saturation, a small amount of positive current may flow into the gate 816 from the source (e.g., the inter-stage matching circuit 512). To reduce drain current, a more negative gate bias voltage may be applied (e.g., by the RFIC 402, RFIC 404A, TRM 404B, or controller 310) to the gate bias voltage line 802, wherein the more negative gate bias voltage may be based at least in part on the resistances of the first gate bias resistor assembly 804 and the second gate bias resistor assembly 806. As the rate of drain current change slows down, the rate of output phase change also slows down. As such, for example, by implementing the third stage 514 to have suitable values for the transistor 808 (such as size and gate properties) and to have a suitable gate bias network (e.g., suitable resistances for the first gate bias resistor assembly 804 and the second gate bias resistor assembly 806 arranged in relation to the gate bias voltage line 802), the third stage 514 may be operated at saturation with zero or near zero AM-PM distortion by adjusting (e.g., actively adjusting) gate bias voltage applied to the gate bias voltage line 802 based at least on a detected phase change (e.g., detected by the phase detector 518) between the output and input of the third stage 514 or between the output and input of the power amplifier 204. That is, for example, some embodiments may be implemented including a phase feedback loop such that as a phase change is detected by the phase detector 518, the gate bias voltage is reactively adjusted based on the phase feedback from the phase detector 518 so as to reduce the phase change to approximately zero. For example, if a positive phase change is detected, a more negative gate bias voltage may be applied to the gate bias voltage line 802 until no phase change is detected by the phase detector 518. The gate bias voltage may be actively adjusted in response to the detected phase change (e.g. detected by the phase detector 518) to reduce the phase change to approximately zero or zero as power input is increased or decreased; and thus, by actively adjusting the gate bias voltage, the third stage 514 may be operated at saturation with zero or substantially zero AM-PM distortion.

In an exemplary embodiment where the power amplifier 204 is a three-stage RF power amplifier, the first stage 506 and the second stage 510 may be considered pre-final stages of the power amplifier 204, and the third stage 514 may be considered the final stage of the power amplifier 204. While the third stage 514 is described with respect to an exemplary embodiment of the power amplifier 204 having three stages, in other embodiments where a power amplifier may have a different number of stages, a final stage of such power amplifier may be implemented and function similarly to the third stage 514 of the power amplifier 204.

Figure 9:
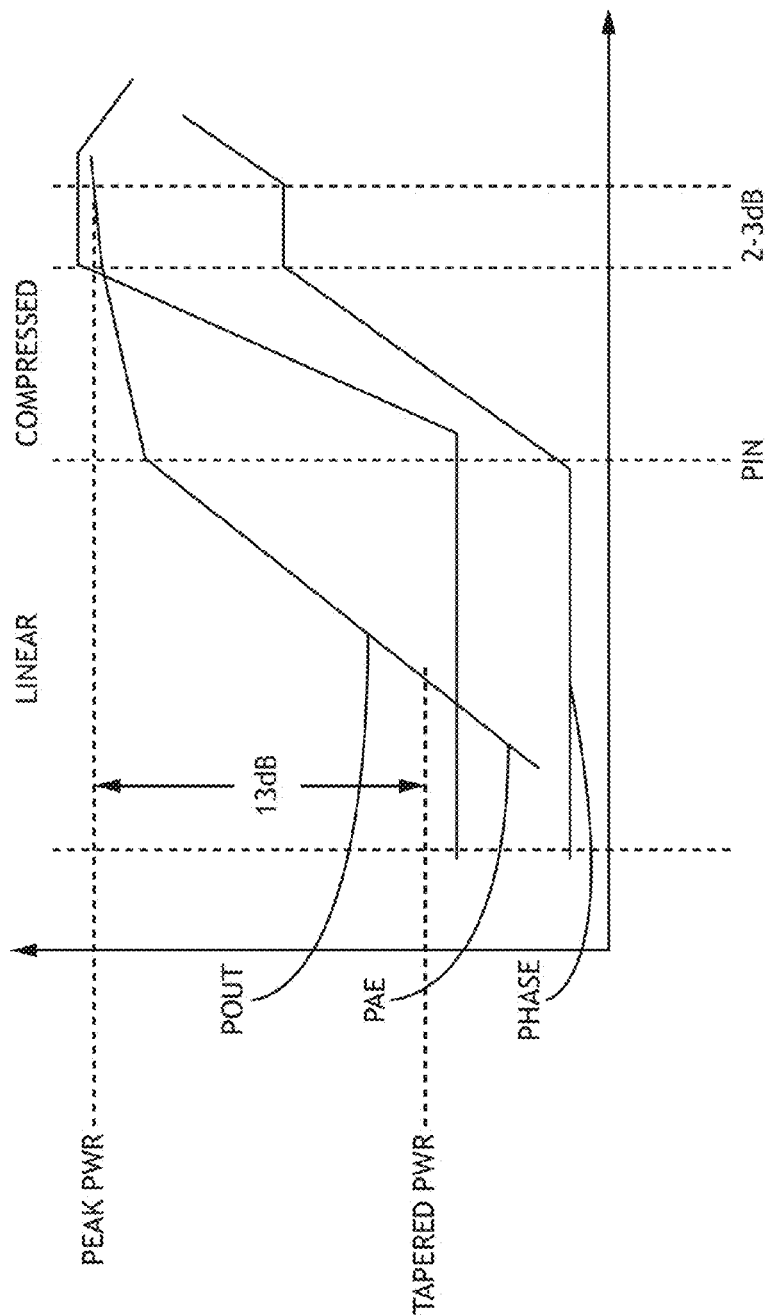
FIG. 9 is a graph of output phase, PAE, and RF power output plotted against RF power input for a power amplifier of an exemplary embodiment according to the inventive concepts disclosed herein.
Figure 10:
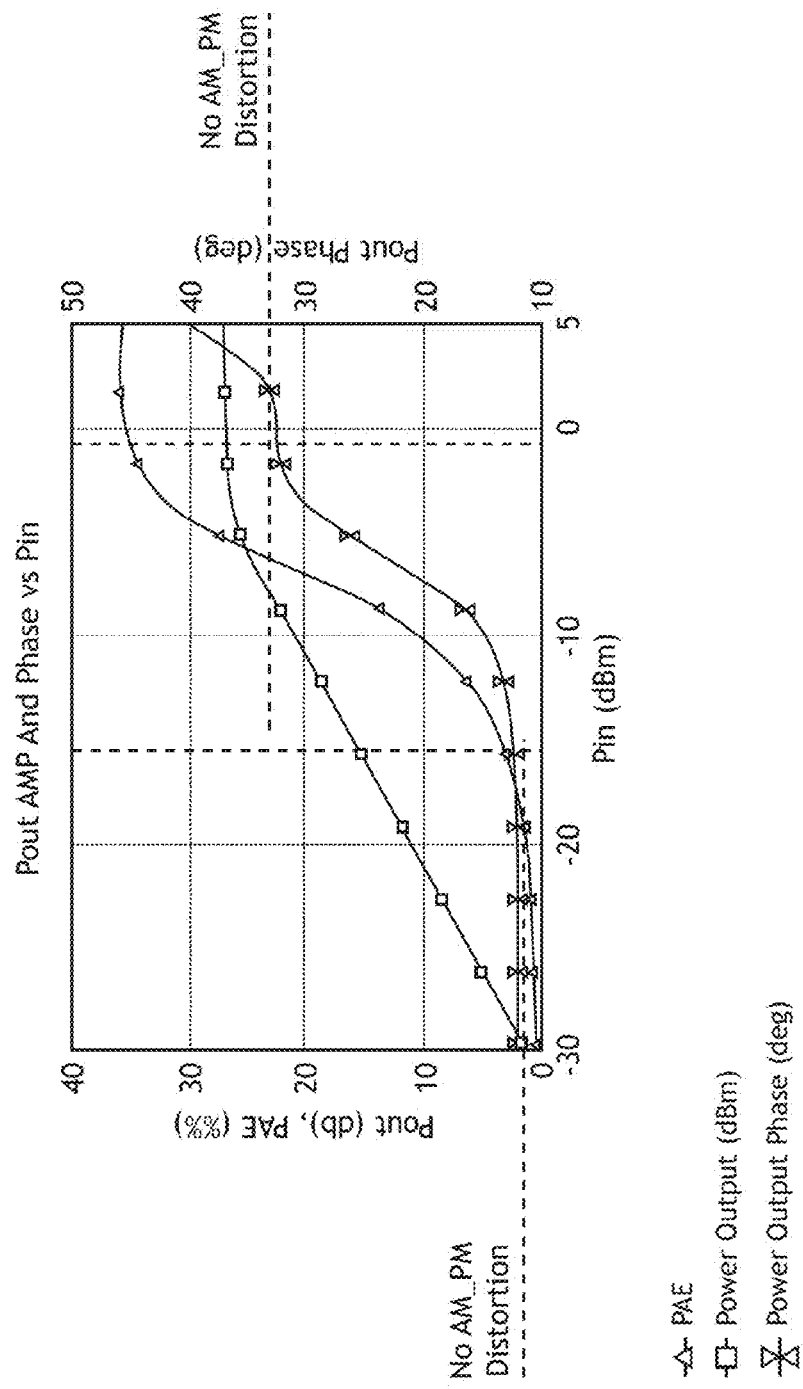
FIG. 10 is a graph of output phase, PAE, and RF power output plotted against RF power input for a power amplifier of an exemplary embodiment according to the inventive concepts disclosed herein.

Referring now to FIGS. 9-10, graphs show output phase, PAE, and RF power output plotted against RF power input for the power amplifier 204 of an exemplary embodiment according to the inventive concepts disclosed herein. As shown, at both peak power output and tapered power output, the phases of transmitted power (e.g., output power) from the power amplifier 204 are insensitive to the RF power input driving the power amplifier 204, despite the phases being different by tens of degrees. That is, the graphs of the phase depict that there are two areas of flat phase (e.g., indicative of no phase change) in the linear region and the compression region (e.g., at saturation). Due to the two areas of zero phase change in the linear region and compression region, the power amplifier 204 may be operated with zero or substantially zero AM-PM distortion in both the linear region and at saturation. Because each power amplifier 204 may be operated with zero or substantially zero AM-PM distortion in both the linear region and at saturation, calibration of the ESA 106 may be much easier, and the time to perform testing and calibration of the ESA 106 may be significantly reduced.

Figure 11:
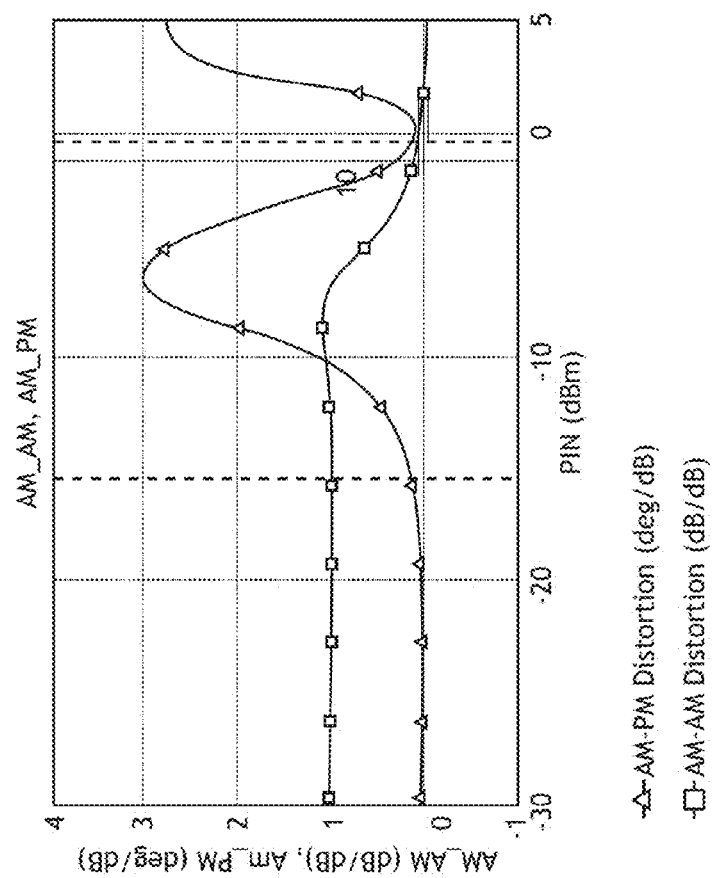
FIG. 11 is a graph of AM-AM distortion and AM-PM distortion plotted against RF power input for a power amplifier of an exemplary embodiment according to the inventive concepts disclosed herein

Referring now to FIG. 11, a graph shows AM-AM distortion and AM-PM distortion plotted against RF power input for the power amplifier 204 of an exemplary embodiment according to the inventive concepts disclosed herein. As shown, the AM-PM distortion is approximately zero in the linear region for RF power inputs approximately between −30 dBm and −15.49 dBm. Additionally, the AM-PM distortion is approximately zero in the compression region for RF power inputs approximately between −0.4076 dBm and 0.4 dBm. Further, the power amplifier may be operated with an AM-AM distortion of approximately 1.0 (dB/dB) in the linear region and with an AM-AM distortion of approximately 0.15 (dB/dB) at saturation.

Figure 12:
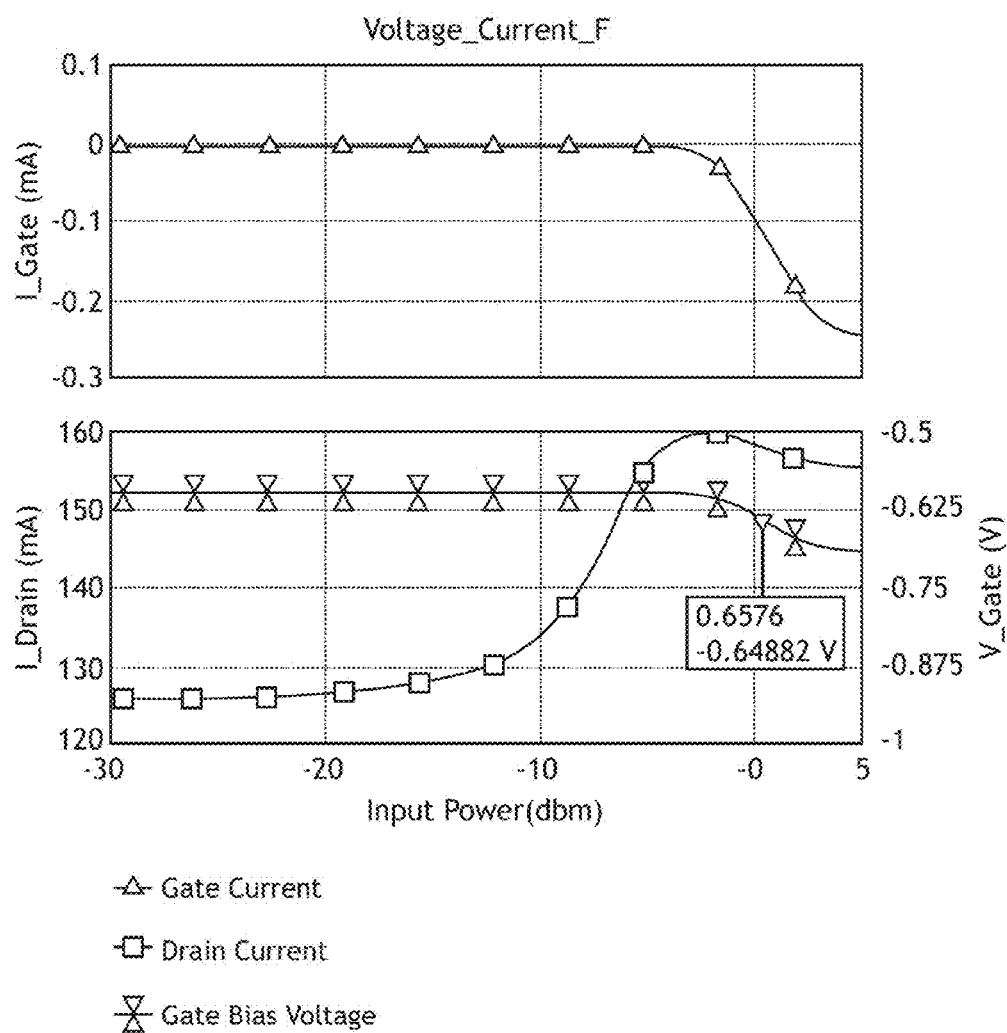
FIG. 12 is a graph of gate current, drain current, and gate bias voltage plotted against RF input power for the third stage of the power amplifier of FIGS. 5 and 8 of an exemplary embodiment according to the inventive concepts disclosed herein.

Referring now to FIG. 12, a graph shows gate current (e.g., "I_Gate (mA)"), drain current (e.g., "I_Drain (mA)"), and gate bias voltage (e.g., "V_Gate (V)") plotted against RF input power (dBm) for the third stage 514 of the power amplifier 204 of an exemplary embodiment according to the inventive concepts disclosed herein. As shown, as the RF power input increases toward saturation, the gate current and drain current change. As the drain current begins to change (e.g., increase), the output phase also changes (e.g., increases). To counter the drain current change and the phase change, a more negative gate bias voltage may be applied (e.g., by the RFIC 402, RFIC 404A, TRM 404B, or controller 310) to the gate bias voltage line 802 to flatten the drain current such that the rate of change of the drain current is approximately zero, which results in the rate of change of the output phase being approximately zero. As such, operating the third stage 514 of the power amplifier 204 at saturation with approximately zero phase change allows the power amplifier 204 to operate at saturation with approximately zero AM-PM distortion.

Figure 13:
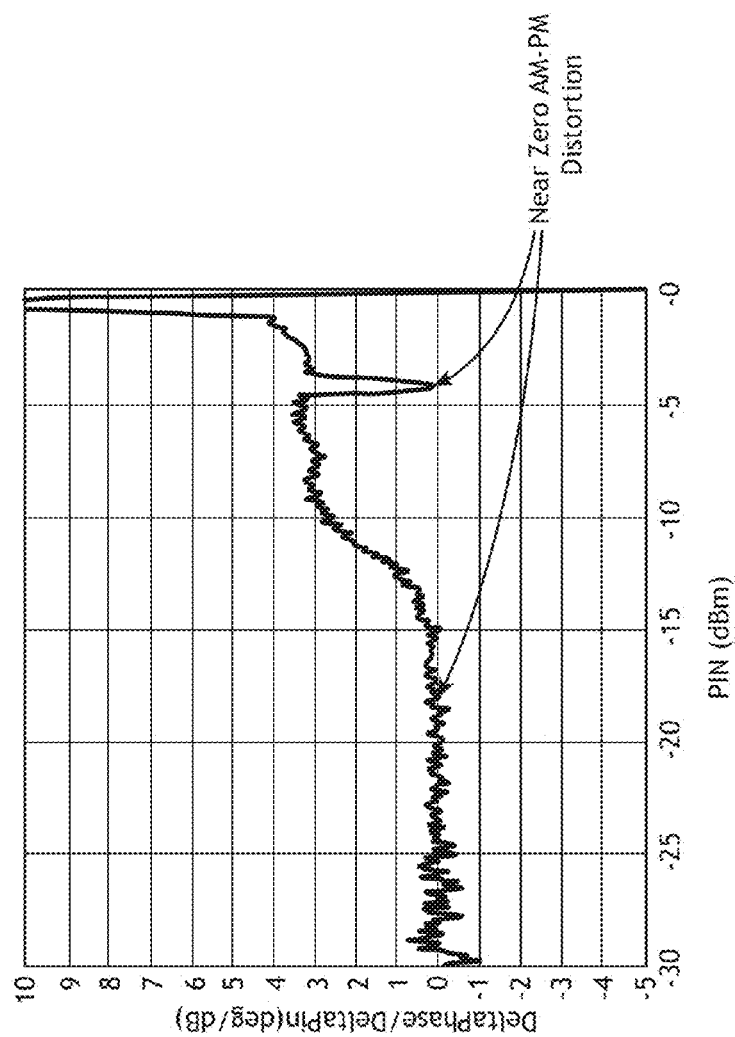
FIG. 13 is a graph of AM-PM distortion plotted against RF power input for a power amplifier of an exemplary embodiment according to the inventive concepts disclosed herein.

Referring now to FIG. 13, a graph shows AM-PM distortion plotted against RF power input for the power amplifier 204 of an exemplary embodiment according to the inventive concepts disclosed herein.

Figure 14:
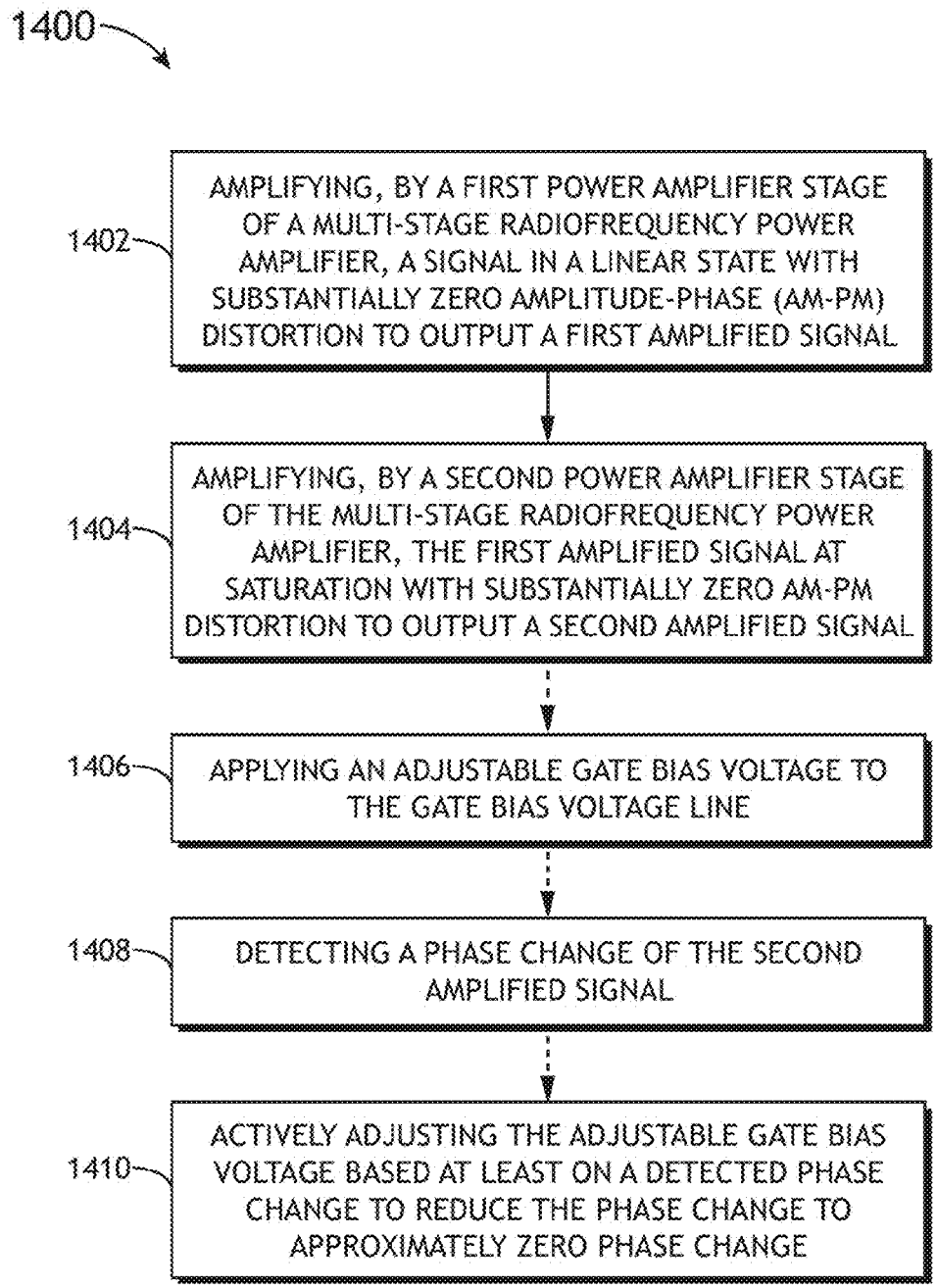
FIG. 14 is a diagram of an exemplary embodiment of a method of operating a multi-stage radiofrequency power amplifier according to the inventive concepts disclosed herein.

Referring now to FIG. 14, an exemplary embodiment of a method 1400 of operating a multi-stage radiofrequency power amplifier according to the inventive concepts disclosed herein may include one or more of the following steps.

A step 1402 may include amplifying, by a first power amplifier stage of a multi-stage radiofrequency power amplifier, a signal in a linear state with substantially zero AM-PM distortion to output a first amplified signal. The multi-stage radiofrequency power amplifier of FIG. 14 may exemplarily be implemented as the power amplifier 204, and the first power amplifier stage of FIG. 14 may exemplarily be implemented as the first stage 506 or the second stage 510 as exemplarily depicted in FIGS. 5-7.

A step 1404 may include amplifying, by a second power amplifier stage of the multi-stage radiofrequency power amplifier, the first amplified signal at saturation with substantially zero AM-PM distortion to output a second amplified signal. The second power amplifier stage of FIG. 14 may exemplarily be implemented as the third stage 514 as exemplarily depicted in FIGS. 5 and 8.

A step 1406 may include applying an adjustable gate bias voltage to the gate bias voltage line. The step 1406 may exemplarily be performed by a controller device, which may be implemented as at least one of the RFIC 402, the RFIC 404A, the TRM 404B, the controller 310, the processor 108, and the processor 114.

A step 1408 may include detecting a phase change of the second amplified signal. The step 1408 may exemplarily be performed by the phase detector 518.

A step 1410 may include actively adjusting the adjustable gate bias voltage based at least on a detected phase change to reduce the phase change to approximately zero phase change. The step 1410 may exemplarily be performed by the controller device, which may be implemented as at least one of the RFIC 402, the RFIC 404A, the TRM 404B, the controller 310, the processor 108, and the processor 114. For example, the controller device may apply a more negative gate bias voltage if a positive phase change is detected, apply a constant gate bias voltage if approximately zero phase change is detected, and apply a less negative gate bias voltage if a negative phase change is detected.

Further, the method 1400 may include any of the operations disclosed throughout.

Figure 15:
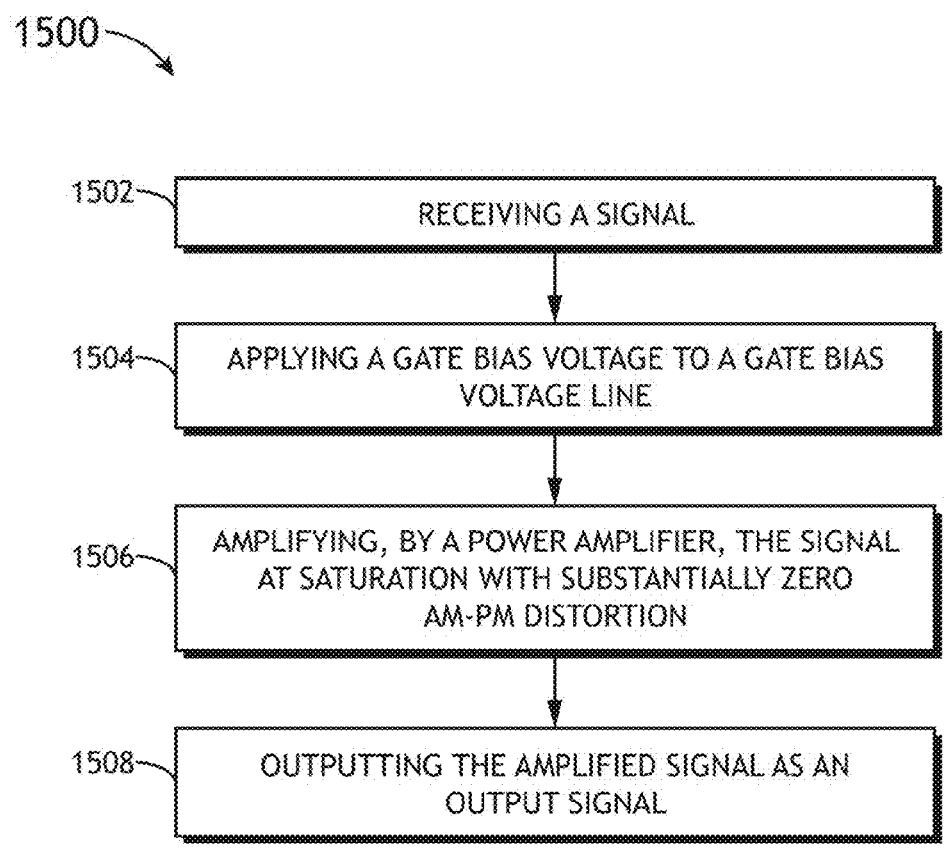
FIG. 15 is a diagram of an exemplary embodiment of a method of operating a power amplifier according to the inventive concepts disclosed herein.

Referring now to FIG. 15, an exemplary embodiment of a method 1500 of operating a power amplifier according to the inventive concepts disclosed herein may include one or more of the following steps. The power amplifier of the method 1500 may be a single stage power amplifier or a multi-stage power amplifier.

A step 1502 may include receiving a signal. The step 1502 may be performed by the power amplifier 204 or a component thereof.

A step 1504 may include applying a gate bias voltage to a gate bias voltage line. The step 1504 may be performed by at least one of the RFIC 402, the RFIC 404A, the TRM 404B, the controller 310, the processor 108, and the processor 114.

In some embodiments, the step 1504 may include self-biasing. For example, the gate bias voltage line may include a gate bias resistor assembly having a resistance such that applying the gate bias voltage to the gate bias voltage line is subject to the resistance of the gate bias resistor assembly. As a result of self-biasing, the power amplifier may be configured to amplify the signal at saturation with substantially zero AM-PM distortion to output the amplified signal based at least on the resistance of the gate bias resistor assembly.

In some embodiments, the step 1504 may include active gate biasing by utilizing an adjustable gate bias voltage. The step 1504 may include detecting a phase change of the second amplified signal and actively adjusting the adjustable gate bias voltage based at least on a detected phase change to reduce the phase change to approximately zero phase change.

A step 1506 may include amplifying, by a power amplifier, the signal at saturation with substantially zero AM-PM distortion. The power amplifier of the step 1506 may be implemented as the power amplifier 204 or a component thereof.

A step 1508 may include outputting the amplified signal as an output signal. The step 1508 may be performed by the power amplifier 204 or a component thereof.

Further, the method 1500 may include any of the operations disclosed throughout.

As will be appreciated from the above, the ESA 106 according to embodiments of the inventive concepts disclosed herein may be configured to operate with substantially zero AM-PM distortion in a linear region and substantially zero AM-PM distortion in a saturation region, thereby allowing for significant reduction of time required to test and calibrate an ESA system.

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A power amplifier, comprising:
   a power amplifier stage; and
   a matching circuit coupled to the power amplifier stage, the matching circuit configured to:
      receive a signal;
      perform at least one signal matching operation on the signal; and
      output the signal to the power amplifier stage;
   wherein the power amplifier stage is configured to:
      receive the signal from the matching circuit;
      amplify the signal at saturation with substantially zero amplitude-phase (AM-PM) distortion; and
      output the amplified signal as an output signal;
   wherein the power amplifier stage comprises:
      a gate bias voltage line comprising a gate bias resistor assembly having a resistance; and
      a transistor comprising a gate coupled to and biased by the gate bias voltage line such that the power amplifier stage is configured to amplify the output signal at saturation with substantially zero AM-PM distortion based at least on the resistance of the gate bias resistor assembly.

2. The power amplifier of claim 1, wherein the power amplifier stage is further configured to amplify signals in a linear state with substantially zero AM-PM distortion.

3. The power amplifier of claim 1, wherein the power amplifier is a multi-stage power amplifier, the power amplifier stage being a final power amplifier stage, the power amplifier further comprising a pre-final power amplifier stage configured to amplify an input signal in a linear state with substantially zero AM-PM distortion to output an amplified input signal to be received by the matching circuit as the signal, wherein the matching circuit is coupled between the pre-final power amplifier stage and the final power amplifier stage.

4. The power amplifier of claim 1, wherein the power amplifier is a three-stage power amplifier, the power amplifier stage being a final power amplifier stage, the power amplifier further comprising a first pre-final power amplifier stage and a second pre-final power amplifier stage, the first pre-final power amplifier stage configured to amplify an input signal in a linear state with substantially zero AM-PM distortion to output a first amplified signal to the second pre-final power amplifier stage, the second pre-final power amplifier stage configured to amplify the first amplified signal in a linear state with substantially zero AM-PM distortion to output a second amplified signal to be received by the matching circuit as the signal, wherein the matching circuit is coupled between the second pre-final power amplifier stage and the final power amplifier stage.

5. The power amplifier of claim 1, wherein the transistor is biased by an adjustable gate bias voltage.

6. The power amplifier of claim 5, wherein the adjustable gate bias voltage is applied to the gate bias voltage line.

7. The power amplifier of claim 1, wherein the matching circuit being configured to perform the at least one signal matching operation on the signal includes the matching circuit being configured to perform impedance matching on the signal.

8. The power amplifier of claim 1, wherein the matching circuit comprises one or more transistors and one or more capacitors.

9. An electronically scanned array, comprising:
   a plurality of antenna elements; and
   a plurality of power amplifiers including a power amplifier, each of the plurality of power amplifiers coupled to one or more of the plurality of antenna elements, the power amplifier comprising:
      a power amplifier stage; and
      a matching circuit coupled to the power amplifier stage, the matching circuit configured to:
         receive a signal;
         perform at least one signal matching operation on the signal; and
         output the signal to the power amplifier stage;
      wherein the power amplifier stage is configured to:
         receive the signal;
         amplify the signal at saturation with substantially zero amplitude-phase (AM-PM) distortion; and
         output the amplified signal as an output signal;
      wherein the power amplifier stage comprises:
         a gate bias voltage line comprising a gate bias resistor assembly having a resistance; and
         a transistor comprising a gate coupled to and biased by the gate bias voltage line such that the power amplifier stage is configured to amplify the signal at saturation with substantially zero AM-PM distortion based at least on the resistance of the gate bias resistor assembly.

10. The electronically scanned array of claim 9, wherein the transistor is biased by an adjustable gate bias voltage applied to the gate bias voltage line.

11. The electronically scanned array of claim 10, further comprising a phase detector configured to detect a phase change of the output signal.

12. The electronically scanned array of claim 11, further comprising a controller device communicatively coupled to the phase detector and configured to adjust the adjustable gate bias voltage applied to the gate bias voltage line based at least on a detected phase change.

13. The electronically scanned array of claim 12, wherein the controller device includes at least one of a radiofrequency integrated circuit (RFIC), a transmit/receive module, a controller, and a processor.

14. The electronically scanned array of claim 12, wherein the controller device is configured to actively adjust the adjustable gate bias voltage applied to the gate bias voltage line such that a more negative gate bias voltage is applied if a positive phase change is detected, a constant gate bias voltage is applied if approximately zero phase change is detected, and a less negative gate bias voltage is applied if a negative phase change is detected.

15. A method of operating a power amplifier, the method comprising:
   receiving, by a matching circuit, a signal, wherein the matching circuit is coupled to a power amplifier stage;
   perform, by the matching circuit, at least one signal matching operation on the signal;
   outputting, by the matching circuit, the signal to the power amplifier stage;
   receiving, by the power amplifier stage, the signal;
   amplifying, by the power amplifier stage, the signal at saturation with substantially zero amplitude-phase (AM-PM) distortion; and
   outputting, by the power amplifier stage, the amplified signal as an output signal,
   wherein the power amplifier comprises the matching circuit and the power amplifier stage comprising a gate bias voltage line and a transistor comprising a gate coupled to the gate bias voltage line, the gate bias voltage line comprising a gate bias resistor assembly having a resistance, the method further comprising:
      applying a gate bias voltage to the gate bias voltage line subject to the resistance of the gate bias resistor assembly,
      wherein amplifying the signal at saturation with substantially zero AM-PM distortion to output the amplified signal is based at least on the resistance of the gate bias resistor assembly.

16. The method of claim 15, wherein the gate bias voltage is an adjustable gate bias voltage, the method further comprising:
   detecting a phase change of the amplified signal; and
   actively adjusting the adjustable gate bias voltage based at least on a detected phase change to reduce the phase change to approximately zero phase change.

* * * * *